United States Patent
Takahashi et al.

(10) Patent No.: US 6,897,964 B2
(45) Date of Patent: *May 24, 2005

(54) THICKNESS MEASURING APPARATUS, THICKNESS MEASURING METHOD, AND WET ETCHING APPARATUS AND WET ETCHING METHOD UTILIZING THEM

(75) Inventors: Teruo Takahashi, Hamamatsu (JP); Motoyuki Watanabe, Hamamatsu (JP); Hidenori Takahashi, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 350 days.

This patent is subject to a terminal disclaimer.

(21) Appl. No.: 10/181,557

(22) PCT Filed: Jan. 16, 2001

(86) PCT No.: PCT/JP01/00212

§ 371 (c)(1), (2), (4) Date: Sep. 4, 2002

(87) PCT Pub. No.: WO01/59830

PCT Pub. Date: Aug. 16, 2001

(65) Prior Publication Data

US 2003/0090671 A1 May 15, 2003

(30) Foreign Application Priority Data

Jan. 21, 2000 (JP) .................................. 2000-13151
Dec. 6, 2000 (JP) .................................. 2000-371621

(51) Int. Cl.[7] ............................ G01B 9/02; G01B 11/28
(52) U.S. Cl. ..................... 356/503; 356/630; 356/479
(58) Field of Search ................................ 356/503, 504, 356/497, 479, 630, 631, 632

(56) References Cited

U.S. PATENT DOCUMENTS 5,220,405 A    6/1993   Barbee et al.
5,392,124 A    2/1995   Barbee et al.
6,768,552 B2 *  7/2004   Takahashi et al. .......... 356/479

FOREIGN PATENT DOCUMENTS

EP    0 905 476 A2    3/1999
JP    5-248817        9/1993
JP    11/354489       12/1999

* cited by examiner

Primary Examiner—Gregory J. Toatley, Jr.
Assistant Examiner—Patrick Connolly
(74) Attorney, Agent, or Firm—Morgan, Lewis & Bockius LLP

(57) ABSTRACT

At each measurement time, measurement light is supplied from a measurement light source 11, and interference light obtained when reflected light from a semiconductor wafer W and reference light from a reference light generating section 14 are coupled is detected by a photodetector 15. A thickness calculating section 16 obtains a light intensity distribution representing the correlation between the light intensity of the interference light and the reference optical path length, selects a wafer upper surface peak and wafer lower surface peak from a plurality of light intensity peaks in the light intensity distribution using a predetermined selection criterion, and calculates the thickness of the semiconductor wafer W from the optical path length difference between the light intensity peaks. With this arrangement, a thickness measuring apparatus and thickness measuring method capable of measuring the thickness of a semiconductor wafer during execution of wet etching independently of the presence of an etchant, and a wet etching apparatus and wet etching method using the thickness measuring apparatus and method are implemented.

28 Claims, 9 Drawing Sheets

THICKNESS MEASURING APPARATUS, THICKNESS MEASURING METHOD, AND WET ETCHING APPARATUS AND WET ETCHING METHOD UTILIZING THEM

TECHNICAL FIELD

The present invention relates to a thickness measuring apparatus and thickness measuring method of measuring the thickness of a semiconductor wafer during execution of wet etching and a wet etching apparatus and wet etching method using the thickness measuring apparatus and method.

BACKGROUND ART

In manufacturing semiconductor devices, recently, the necessity of an etching process for thinning a semiconductor wafer with a pattern is increasing.

In such an etching process, a wet etching apparatus for etching a semiconductor wafer while supplying an etchant is used. In a conventional wet etching method, a dummy wafer is etched to confirm the etching rate in advance, and the etching end time is determined on the basis of the etching rate.

However, when such an etching time management method is used, an extra process for etching a dummy wafer is necessary in addition to an actual etching process. In addition, the etching rate may change for each etching process. For this reason, time management assuming a fixed etching rate generates a variation in thickness of resultant semiconductor wafers.

To increase the etching accuracy or operation efficiency in the etching process, the thickness of a semiconductor wafer portion must be measured in situ during etching. With this measurement, data of a change in thickness over time during etching can be obtained whereby the end time can be obtained for each etching process. That is, various etching processes can be managed and controlled.

DISCLOSURE OF INVENTION

Conventional semiconductor wafer thickness measuring apparatuses include a contact thickness meter and Michelson interference thickness meter. Of these thickness meters, the contact thickness meter cannot be applied to measurement in situ. In addition, since this thickness meter comes into contact with a semiconductor wafer, the wafer may be damaged, and therefore, measurement at a high speed is impossible. If a wafer has a holding substrate or film, the thickness of only the wafer cannot be measured.

On the other hand, the Michelson interference thickness meter measures the thickness of a semiconductor wafer in a noncontact state. As such a thickness meter, an apparatus is disclosed in Japanese Patent Application Laid-Open No. H5-248817. This apparatus irradiates a semiconductor wafer with measurement light and measures a change in thickness over time on the basis of a change in reflection timing of reflected light from the wafer surface. In this case, however, only the position on the upper surface is measured. To obtain the thickness, an initial condition of thickness, such as the position on the lower surface, must be given. Additionally, in a wet etching process using an etchant, since measurement light is reflected by the etchant on the wafer surface, the thickness of the semiconductor wafer cannot be measured.

Another example of a thickness meter for measuring the thickness of a semiconductor wafer in a noncontact state is an electrostatic-capacitance-type thickness meter. However, this thickness meter cannot measure the thickness of only a semiconductor wafer when the semiconductor wafer has a holding substrate or film, or a pattern is formed on the semiconductor wafer.

The present invention has been made to solve the above problems, and has as its object to provide a thickness measuring apparatus and thickness measuring method which can measure the thickness of a semiconductor wafer during execution of wet etching, and a wet etching apparatus and wet etching method using the thickness measuring apparatus and method.

In order to achieve the above object, according to the present invention, there is provided a thickness measuring apparatus for measuring a thickness of a semiconductor wafer during execution of wet etching using an etchant, characterized by comprising (1) a measurement light source which supplies measurement light at a predetermined measurement time, (2) light branching means for branching the measurement light from the measurement light source, (3) light output means for outputting one component of the measurement light branched by the light branching means to the semiconductor wafer as a measurement object so as to irradiate the semiconductor wafer from a side of an etching surface to which the etchant is being supplied, (4) light input means for inputting reflected light obtained when the measurement light irradiated from the light output means is reflected by the etchant or semiconductor wafer, (5) reference light generating means for passing the other component of the measurement light branched by the light branching means through a reference optical path designed to be able to change an optical path length so as to generate reference light for which a reference optical path length is set, (6) light coupling means for obtaining interference light by coupling the reflected light from the light input means to the reference light from the reference light generating means, (7) photodetection means for detecting the interference light from the light coupling means, and (8) thickness calculating means having raw thickness value calculating means for calculating a raw thickness value of the semiconductor wafer on the basis of an optical path length difference in reference optical path length between two light intensity peaks selected, as a wafer upper surface peak and wafer lower surface peak, from a plurality of light intensity peaks on the basis of a predetermined selection criterion, using a light intensity distribution representing a correlation between the reference optical path length set by the reference light generating means and a light intensity of the interference light detected by the photodetection means at the measurement time.

According to the present invention, there is also provided a thickness measuring method of measuring a thickness of a semiconductor wafer during execution of wet etching using an etchant, characterized by comprising (1) the measurement light supply step of supplying measurement light from a measurement light source at a predetermined measurement time, (2) the light branching step of branching the measurement light from the measurement light source, (3) the light output step of outputting one component of the measurement light branched in the light branching step to the semiconductor wafer as a measurement object so as to irradiate the semiconductor wafer from a side of an etching surface to which the etchant is being supplied, (4) the light input step of inputting reflected light obtained when the measurement light irradiated in the light output step is reflected by the etchant or semiconductor wafer, (5) the reference light generating step of passing the other component of the measurement light branched in the light branching step through a reference optical path designed to be able to change an optical path length so as to generate reference light for which a reference optical path length is set, (6) the light coupling step of obtaining interference light by coupling the reflected light input in the light input step to the reference light generated in the reference light generating step, (7) the photodetection step of detecting the interference light coupled in the light coupling step, and (8) the thickness calculating step including the raw thickness value calculating step of calculating a raw thickness value of the semiconductor wafer on the basis of an optical path length difference in reference optical path length between two light intensity peaks selected, as a wafer upper surface peak and wafer lower surface peak, from a plurality of light intensity peaks on the basis of a predetermined selection criterion, using a light intensity distribution representing a correlation between the reference optical path length set in the reference light generating step and a light intensity of the interference light detected in the photodetection step at the measurement time.

In the above-described thickness measuring apparatus and thickness measuring method, reflected light obtained when the semiconductor wafer is irradiated with measurement light, and the measurement light is reflected is coupled to reference light that is branched from the measurement light and passes through a predetermined optical path to set a reference optical path length with respect to the optical path length of the reflected light, and the resultant interference light is detected. The thickness of the semiconductor wafer during wet etching is measured from a plurality of light intensity peaks generated in the light intensity distribution of the interference light.

At this time, the measurement light with which the semiconductor wafer is irradiated is reflected by the etchant surface and the upper surface (etching surface) and lower surface of the semiconductor wafer. Light intensity peaks corresponding to the surfaces are obtained in the light intensity distribution. Hence, when two light intensity peaks corresponding to the upper and lower surfaces of the semiconductor wafer, which are selected on the basis of a predetermined selection criterion, are used, the thickness of the semiconductor wafer or a time-rate change in thickness can be measured during wet etching independently of the presence of the etchant. In addition, instead of obtaining the thickness from the reflected light from the wafer upper surface and initial conditions as a reference, reflected light from both the upper and lower surfaces of the wafer are used. For this reason, even when the state of the semiconductor wafer or etchant changes, the thickness of the semiconductor wafer can always be accurately measured.

As the selection criterion for the wafer upper surface peak and wafer lower surface peak in the light intensity distribution, various methods can be used. For example, a method of selecting second and third light intensity peaks from the small reference optical path length side out of a plurality of light intensity peaks each having a light intensity more than a set threshold value, or a method of selecting, as the wafer upper surface peak, a light intensity peak having a maximum light intensity from the plurality of light intensity peaks can be used.

According to a wet etching apparatus and method using the thickness measuring apparatus and method, on the basis of the thickness value obtained for the semiconductor wafer during wet etching, the end of wet etching by stopping supply of the etchant, or change of the etching rate can be appropriately controlled through the etching control means.

BEST MODE OF CARRYING OUT THE INVENTION

Figure 1:
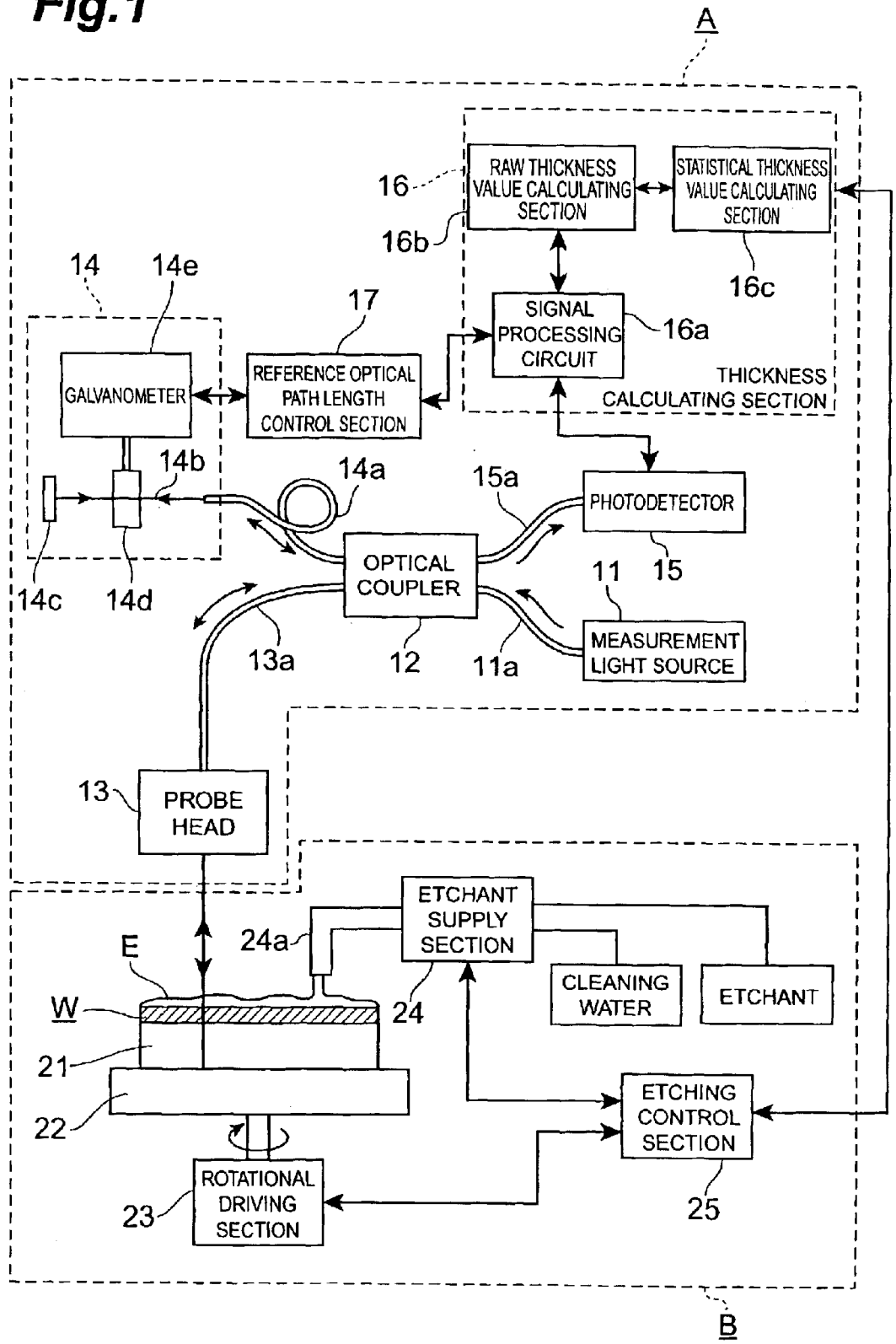
FIG. 1 is a block diagram showing an embodiment of a thickness measuring apparatus and a wet etching apparatus having the thickness measuring apparatus.

A preferred embodiment of a thickness measuring apparatus and thickness measuring method according to the present invention, and a wet etching apparatus and wet etching method using the thickness measuring apparatus and method will be described below with reference to the accompanying drawings. The same reference numerals denote the same elements throughout the drawings, and a repetitive description thereof will be omitted. The dimensional ratios in the drawings do not always match those in the description.

First, the arrangements of a thickness measuring apparatus and wet etching apparatus according to the present invention will be described together with steps in a corresponding thickness measuring method. FIG. 1 is a block diagram showing an embodiment of a thickness measuring apparatus and a wet etching apparatus having the thickness measuring apparatus. This wet etching apparatus comprises a thickness measuring apparatus A and a normal wet etching apparatus B except for the thickness measuring apparatus A (this apparatus portion will be simply referred to as a wet etching apparatus B hereinafter).

The thickness measuring apparatus A is a noncontact thickness meter designed to irradiate a semiconductor wafer W to be measured with measurement light and measure the thickness of the semiconductor wafer W using a change in light intensity of interference light that is generated by interference between reference light and reflected light by the semiconductor wafer W. Measurement light to be used for thickness measurement is supplied from a measurement light source 11 (measurement light supply step) at a predetermined measurement time. The measurement light output from the measurement light source 11 is input to an optical coupler 12 formed from a fiber coupler through an input optical fiber 11a. As the measurement light source 11, a low-coherence light source (e.g., an SLD that generates light having a wavelength of 1.3 $\mu$m) is preferably used. As the wavelength of measurement light, a wavelength that sufficiently transmits through the semiconductor wafer W or an etchant is selected.

The optical coupler 12 functions as a light branching means for branching the measurement light from the measurement light source 11. The measurement light input to the optical coupler 12 is branched to a measurement optical fiber 13a leading to a measurement optical path and a reference optical fiber 14a leading to a reference optical path (light branching step). The branched measurement light components are input to a probe head 13 for measuring the thickness and a reference light generating section 14 for generating reference light, respectively.

The probe head 13 is a light input/output means functioning as a light output means for irradiating the semiconductor wafer W with measurement light and a light input means for inputting again reflected light that is generated when the semiconductor wafer W or an etchant reflects the measurement light. Of the light components branched by the optical coupler 12, the measurement light branched to the optical fiber 13a side is output from the probe head 13 to the semiconductor wafer W. The semiconductor wafer W is irradiated with the measurement light from the etching surface on the upper side (light output step). As this measurement light, light having a wavelength that is sufficiently transmitted through the semiconductor wafer W or the like is used, as described above. Some components of the measurement light are reflected by each interface. The reflected light reaches and is input to the probe head 13 again (light input step). The reflected light that reaches and is re-input to the probe head 13 is input to the optical coupler 12 through the optical fiber 13a.

On the other hand, in the reference light generating section 14, reference light used to measure the thickness (optical path length) as interference light with reflected light from the semiconductor wafer W or the like is generated (reference light generation step). The measurement light branched to the optical fiber 14a side by the optical coupler 12 changes to reference light for which the optical path length of reference light (reference optical path length) with respect to the optical path length of reflected light (reflection optical path length) from the semiconductor wafer W or the like is set through a reference optical path 14b formed from an optical path length modulation optical system arranged between the output terminal of the optical fiber 14a and a reflecting mirror 14c.

In this embodiment, the measurement light output from the output terminal of the optical fiber 14a is transmitted through a parallel-plate glass substrate 14d and reaches and is reflected by the reflecting mirror 14c. Reflected light from the reflecting mirror 14c is transmitted through the glass substrate 14d again in a reverse direction and is input to the optical coupler 12 through the optical fiber 14a as reference light for which an appropriate reference optical path length is set.

The reference light generating section 14 is designed to change the optical path length of the reference optical path 14b. More specifically, the glass substrate 14d on the reference optical path 14b is attached to a galvanometer 14e. The galvanometer 14e operates on the basis of a periodical signal from a reference optical path length control section 17 whereby the tilt of the glass substrate 14d with respect to the reference optical path 14b periodically changes. At this time, the thickness of the glass substrate 14d when viewed from the direction of reference optical path 14b changes. Hence, the optical path length of the reference optical path 14b periodically changes, and the reference optical path length with respect to the reflection optical path length (timing of reference light with respect to reflected light) is periodically scanned.

As described above, the optical coupler 12 serves as a light branching means for branching the measurement light from the measurement light source 11 and also functions as a light coupling means for coupling the reflected light from the probe head 13 to the reference light from the reference light generating section 14. The reflected light that is reflected by the semiconductor wafer W or the like and returns and is input to the probe head 13, and the reference light for which the reference optical path length is set in the reference light generating section 14 are coupled by the optical coupler 12 into interference light (light coupling step). The interference light is input to a photodetector 15 such as a photodiode (PD) through an output optical fiber 15a and detected (photodetection step).

The data and the like of the interference light detected by the photodetector 15 are processed by a thickness calculating section 16. On the basis of these data, the thickness of the semiconductor wafer W is calculated (thickness calculation step). The thickness calculating section 16 of this embodiment has a raw thickness value calculating section 16b for calculating a thickness value (raw thickness value) from the data and the like of the interference light at each measurement time and a statistical thickness value calculating section 16c for calculating a statistical thickness value by executing statistical processing of raw thickness values obtained at a plurality of measurement times.

A detection signal obtained by detecting interference light by the photodetector 15 is input to the raw thickness value calculating section 16b through a signal processing circuit 16a in the thickness calculating section 16. The data of light intensity of the interference light is obtained by the detection signal from the photodetector 15. The angle signal of the galvanometer 14e (glass substrate 14d) from the reference optical path length control section 17 is also input to the raw thickness value calculating section 16b through the signal processing circuit 16a. The data of the reference optical path length or its optical path length change amount in the reference optical path 14b is obtained from the angle signal.

In the raw thickness value calculating section 16b, at each measurement time, a light intensity distribution representing a change (correlation) in light intensity of interference light by the reference optical path length is generated from the light intensity data and reference optical path length data. Using the resultant light intensity distribution, the raw thickness value of the semiconductor wafer W is calculated using two light intensity peaks selected using a predetermined selection criterion from a plurality of light intensity peaks that are specified on the light intensity distribution (raw thickness value calculation step).

The raw thickness value calculated by the raw thickness value calculating section 16b is further input to the statistical thickness value calculating section 16c, as needed. In the statistical thickness value calculating section 16c, a thickness change line is determined by linear approximation (fitting) for a time-rate change in raw thickness value obtained at each of the plurality of measurement times. A statistical thickness value is calculated from the thickness change line (statistical thickness value calculation step).

Details of thickness measurement of the semiconductor wafer W, including reflected light from the semiconductor wafer W or the like, light intensity peaks of a light intensity distribution generated in correspondence with the reflected light and the selection criterion of light intensity peaks, and the method of calculating the raw thickness value and statistical thickness value, will be described later.

The wet etching apparatus B is designed to wet-etch one surface (the upper surface in FIG. 1; to be referred to as an etching surface hereinafter) of the semiconductor wafer W as an etching process object (a measurement object of the thickness measuring apparatus A) using an etchant.

The semiconductor wafer W is fixed on a rotary table 22 while being held by a holding substrate 21 formed from a glass substrate or the like arranged on the opposite surface side of the etching surface. The rotary table 22 is rotatably driven by a rotational driving section 23, thereby rotating the semiconductor wafer W during wet etching. When the semiconductor wafer W has a pattern, the surface with the pattern is set on the holding substrate 21 side. Wet etching is performed while setting the surface on the opposite side of the pattern as the etching surface.

Etchant supply to the etching surface of the semiconductor wafer W is done by an etchant supply section 24. The etchant supply section 24 supplies or stops an etchant or supplies cleaning water to the semiconductor wafer W. When an etchant is supplied from a nozzle 24a to the etching surface of the rotating semiconductor wafer W by the etchant supply section 24, the supplied etchant forms a thin etchant layer E on the surface of the semiconductor wafer W. The surface of the semiconductor wafer W is wet-etched by the etchant layer E.

Rotation of the rotary table 22, the holding substrate 21 mounted on the rotary table 22, and the semiconductor wafer W by the rotational driving section 23 and supply/stop of an etchant or cleaning water to the etching surface of the semiconductor wafer W by the etchant supply section 24 are controlled by an etching control section 25.

The probe head 13 of the thickness measuring apparatus A is set at a position opposing a predetermined portion of the etching surface of the semiconductor wafer W placed on the rotary table 22 together with the holding substrate 21 such that the optical path of measurement light with which the etching surface is irradiated becomes almost perpendicular to the etching surface. At this time, reflected light that is generated when the measurement light with which the etching surface is perpendicularly irradiated is reflected by the semiconductor wafer W or the like is efficiently re-input to the probe head 13.

To prevent corrosion of a lens and the like by the scattered etchant, the probe head 13 preferably has, as a protective film, a transparent sheet made of, e.g., polyvinyl chloride that is resistant against the etchant. Alternatively, sticking of the etchant may be prevented by attaching a cylinder to the distal end of the probe head 13 and pressurizing the interior of the cylinder.

A wet etching method for the semiconductor wafer W using the wet etching apparatus shown in FIG. 1, which is formed from the thickness measuring apparatus A and wet etching apparatus B, will be described using an example.

First, the semiconductor wafer W held by the holding substrate 21 is placed on the rotary table 22. Rotational driving of the rotary table 22 is started on the basis of an instruction signal from the etching control section 25. Subsequently, the etchant supply section 24 is instructed to supply an etchant to the etching surface of the semiconductor wafer W, and wet etching of the semiconductor wafer W is started (etching start step).

When wet etching starts, the thickness of the semiconductor wafer W is measured by the above-described thickness measuring apparatus A and thickness measuring method (thickness measurement step). Thickness measurement is executed at a measurement time instructed by the operator, or automatically at a preset measurement time. The raw thickness value calculating section 16b calculates the raw thickness value from thickness data acquired at each measurement time. The statistical thickness value calculating section 16c calculates a thickness change line representing a change in thickness over time or a statistical thickness value obtained by statistical processing by using the calculated raw thickness values, as needed.

The thickness of the semiconductor wafer W in the wet etching process in progress and the change in thickness over time are evaluated from the calculated raw thickness value or the thickness change line and statistical thickness value. Thickness evaluation can be automatically done by, e.g., the thickness calculating section 16 of the thickness measuring apparatus A. Alternatively, a display device (display) may be connected to the thickness calculating section 16 to display the obtained thickness data on the display device and cause the operator to do evaluation on the basis of the displayed data.

At the wet etching end time, supply of the etchant by the etchant supply section 24 is stopped by an instruction signal from the etching control section 25. Subsequently, cleaning water is supplied to the etching surface of the semiconductor wafer W to clean the semiconductor wafer W for a predetermined time. Supply of cleaning water is stopped. After cleaning of the semiconductor wafer W is ended, the rotary table 22 is rotated for a predetermined time to remove the cleaning water from the etching surface of the semiconductor wafer W. When removal of the cleaning water is ended, rotation of the rotary table 22 by the rotational driving section 23 is stopped, thus ending all processes of wet etching of the semiconductor wafer W (etching end step).

At this time, the wet etching end time may be determined on the basis of etching time or etching rate data given in advance. However, the end time is preferably calculated on the basis of a terminal thickness that is set in advance, from a time-rate change in thickness of the semiconductor wafer W (e.g., a thickness change line) measured by the thickness measuring apparatus A (end time calculation step).

For calculation of the end time, the end time may be automatically obtained by the thickness calculating section 16 or determined by the operator from data displayed on the display device. When the end time is obtained by the thickness calculating section 16, an end instruction signal for instructing the end time may be output from the thickness calculating section 16, and the etching control section 25 may control the end of wet etching on the basis of the end instruction signal.

The method and principle of measurement and calculation of the thickness of the semiconductor wafer W at each measurement time by the thickness measuring apparatus A and thickness measuring method of the above-described embodiment will be described.

Figure 2A:
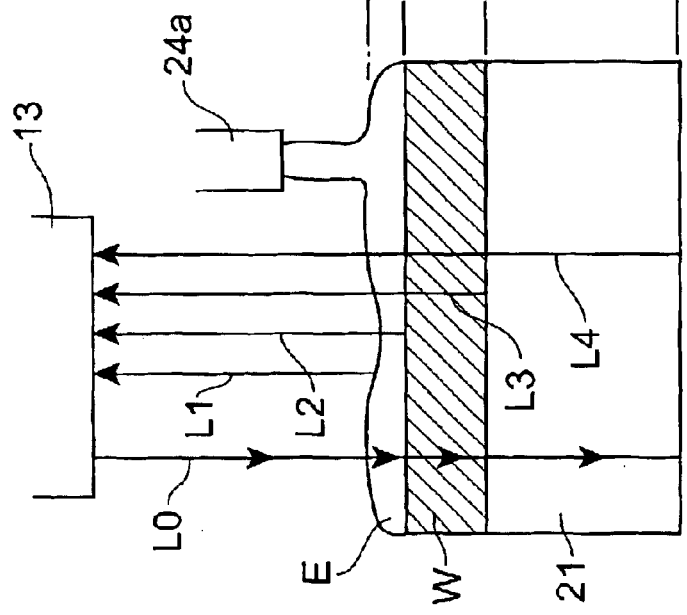
FIGS. 2A and 2B are schematic views showing a method of measuring the thickness of a semiconductor wafer in the wet etching apparatus shown in FIG. 1.
Figure 2B:
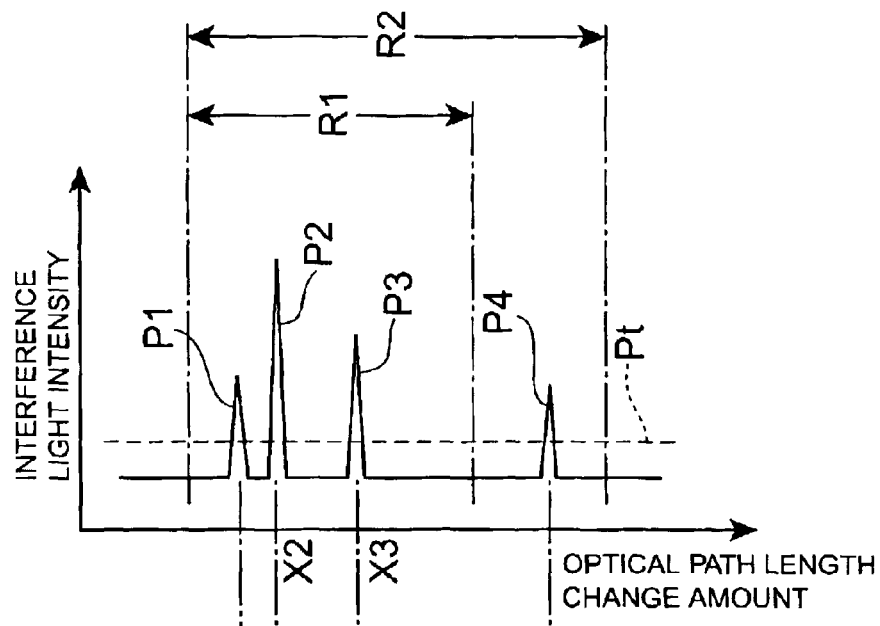

First, a raw thickness value measuring method using a light intensity distribution representing the correlation between the reference optical path length (optical path length change amount) and the interference light intensity will be described. FIGS. 2A and 2B are views schematically showing the method of measuring the thickness of the semiconductor wafer W in the wet etching apparatus shown in FIG. 1. FIG. 2A is a side sectional view showing irradiation of the semiconductor wafer W with measurement light and re-input of reflected light to the probe head 13. FIG. 2B is a graph showing the light intensity distribution of interference light obtained by the photodetector 15. Referring to FIG. 2A, the position of the optical path of measurement light with which the semiconductor wafer W is irradiated is shifted from the position of the optical path of reflected light to the probe head 13, for the illustrative convenience.

Measurement light L0 branched by the optical coupler 12 and output from the probe head 13 is sequentially transmitted through the etchant layer E, semiconductor wafer W, and holding substrate 21. Some components of the measurement light L0 are reflected by the interfaces between adjacent layers. More specifically, reflected light L1 returns from the surface of the etchant layer E, reflected light L2 returns from the upper surface of the semiconductor wafer W, reflected light L3 returns from the lower surface of the semiconductor wafer W, and reflected light L4 returns from the lower surface of the holding substrate 21. These reflected light components returns to and are re-input to the probe head 13.

The re-input reflected light components L1 to L4 pass through different reflection optical paths depending on the interfaces that reflect them, as shown in FIG. 2A, so the reflected light components are input from the probe head 13 to the photodetector 15 through the optical coupler 12 at different timings. In the reference light generating section 14, the optical path length of the reference optical path 14b is periodically changed, as described above, and the reference optical path length (timing of reference light with respect to reflected light) is scanned.

At this time, when the optical path lengths from the optical coupler 12 to the interfaces that have reflected the reflected light components L1 to L4 match the optical path length from the optical coupler 12 to the reflecting mirror 14c, reflected light and reference light whose optical path lengths and timings match strengthen each other by interference. Hence, interference light having a high light intensity is detected by the photodetector 15.

FIG. 2B shows a light intensity distribution representing the correlation between the interference light intensity and the reference optical path length (optical path length change amount) obtained by scanning the optical path length in correspondence with the sectional view shown in FIG. 2A. Referring to this graph, one axis represents the optical path length change amount of the scanned reference optical path 14b, and the other axis represents the light intensity of interference light detected by the photodetector 15. The reference optical path length (optical path length change amount) and optical path length difference do not always accurately correspond to the thicknesses of the etchant layer E, semiconductor wafer W, and holding substrate 21 because of the difference in refractive index. However, FIGS. 2A and 2B show the sectional view and graph in correspondence with each other assuming that there is no difference in refractive index for the descriptive convenience.

As shown in this graph, when the optical path length change amount is scanned in a direction in which the optical path length change amount changes from a smaller value to a larger value (the reference optical path length increases), a light intensity peak P1 (liquid surface peak P1) corresponding to the reflected light L1 from the surface of the etchant layer E, a light intensity peak P2 (wafer upper surface peak P2) corresponding to the reflected light L2 from the upper surface (etching surface) of the semiconductor wafer W, a light intensity peak P3 (wafer lower surface peak P3) corresponding to the reflected light L3 from the lower surface of the semiconductor wafer W, and a light intensity peak P4 (substrate lower surface peak P4) corresponding to the reflected light L4 from the lower surface of the holding substrate 21 are sequentially obtained.

In the thickness measuring apparatus A shown in FIG. 1, in the raw thickness value calculating section 16b (thickness calculating section 16), two light intensity peaks corresponding to the wafer upper surface peak P2 and wafer lower surface peak P3 are selected from the plurality of light intensity peaks on the light intensity distribution shown in FIG. 2B in accordance with the predetermined selection criterion.

The optical path length difference in reference optical path length between the wafer upper surface peak P2 and the wafer lower surface peak P3 corresponds to the optical path length difference from the upper surface to the lower surface of the semiconductor wafer W. Hence, the thickness (raw thickness value) of the semiconductor wafer W can be calculated from the optical path length difference between the two light intensity peaks P2 and P3.

Especially, the thickness of the semiconductor wafer W can be more directly accurately measured by a measuring method using the two light intensity peaks P2 and P3, as described above, instead of measuring an optical path length corresponding to one light intensity peak and its change over time. In addition, thickness measurement when wet etching is in progress, i.e., the etchant flows on the etching surface of the semiconductor wafer W can be executed independently of the presence/absence of the etchant.

The optical path length difference between the light intensity peaks P2 and P3 corresponds to the optical thickness of the semiconductor wafer W. Hence, the final raw thickness value is obtained by dividing the resultant optical path length difference by the refractive index of the semiconductor wafer. As the refractive index value of the semiconductor wafer W used to calculate the raw thickness value, if the refractive index is known, the value is used. The refractive index may be measured in advance using a wafer whose thickness has been measured by another method using a microgauge or microscope, and the measured value is preferably used, as needed.

As a detailed selection criterion used to select the two light intensity peaks corresponding to the wafer upper surface peak P2 and wafer lower surface peak P3, for example, the order of light intensity peaks can be used.

In this selecting method, an appropriate light intensity threshold value (threshold) is set for the light intensity distribution. A plurality of light intensity peaks are selected except for peaks such as small light intensity peaks by a noise signal. Referring to FIG. 2B, a light intensity Pt is indicated by a dotted line as such a threshold intensity.

The light intensity peaks selected by the threshold value correspond to the liquid surface peak P1, wafer upper surface peak P2, wafer lower surface peak P3, and substrate lower surface peak P4 in ascending order of reference optical path length (optical path length change amount). Hence, of the plurality of light intensity peaks having light intensities more than the threshold value, with the second and third light intensity peaks from the small reference optical path length side, the wafer upper surface peak P2 and wafer lower surface peak P3 can be selected.

For the above light intensity peaks P1 to P4, the light intensity ratio or the like varies depending on the state of the semiconductor wafer W or etchant layer E. For example, the state of the etchant layer E on the semiconductor wafer W changes depending on the manner the etchant supplied from the nozzle 24a flows on the etching surface. At this time, since the angle of the surface of the etchant layer E with respect to the optical path of the measurement light changes, the light intensity of the reflected light L1 that is reflected by the surface of the etchant layer E and reaches the probe head 13 also changes. In addition, the light intensities of the light intensity peaks or their ratio also changes depending on the material (Si, GaAs, Doped Si, or the like) used as the semiconductor wafer W or the material of the holding substrate 21.

On the other hand, even when the light intensity ratio of reflected light changes, as described above, the order of the optical path lengths of the light intensity peaks P1 to P4 does not change. That is, the liquid surface peak P1, wafer upper surface peak P2, wafer lower surface peak P3, and substrate lower surface peak P4 are obtained in ascending order of optical path length. Hence, when the second and third light intensity peaks are selected as light intensity peaks more than the threshold value on the light intensity distribution, the wafer upper surface peak P2 and wafer lower surface peak P3 can properly and easily be selected.

As another selection criterion used to select the light intensity peaks, the light intensities of the light intensity peaks can be used.

In this selecting method, a light intensity peak having a maximum light intensity (to be referred to as a maximum peak hereafter) is selected as the wafer upper surface peak P2. In most cases, the wafer upper surface peak P2 is selected as the maximum peak in the light intensity peaks P1 to P4 on the light intensity distribution shown in FIG. 2B, including noise peaks. Hence, according to this selecting method, the wafer upper surface peak P2 can properly and easily be selected.

As described above, the light intensity ratio of the light intensity peaks p1 to P4 varies depending on the state of the semiconductor wafer W or etchant layer E.

On the other hand, even when the light intensity of reflected light or the like changes, as described above, the maximum peak is always the wafer upper surface peak P2 because of the reflection characteristic on each interface or positional relationship between the interfaces. Hence, when the maximum peak on the light intensity distribution is selected, the wafer upper surface peak P2 can properly and easily be selected.

Even in the selecting method using the light intensities of the light intensity peaks, the light intensity peaks may be selected on the basis of a threshold value, as in the selecting method using the order of light intensity peaks. Although a large noise peak may be formed on the light intensity distribution and mistaken as the wafer upper surface peak P2, the probability is very low. When such mistake occurs, an abnormal raw thickness value is obtained. Hence, when an obviously abnormal raw thickness value or the like is excluded, thickness evaluation is hardly influenced.

With the above measuring method, a noncontact thickness measuring apparatus and thickness measuring method capable of measuring the thickness of the semiconductor wafer W in real time during execution of wet etching, and a wet etching apparatus and wet etching method using the thickness measuring apparatus and method are implemented. In addition, when measurement light is supplied from the measurement light source 11 at a predetermined time interval, and thickness measurement is performed at a plurality of measurement times, a time-rate change in thickness of the semiconductor wafer W during wet etching can be obtained, and wet etching can be controlled on the basis of it.

The state of the etchant layer E changes as described above, and its thickness also varies over time, like the angle of the surface. Along with this, the optical path length difference between the light intensity peaks P1 and P2 changes. At this time, the peak position of the light intensity peak P1 shifts, and in addition, the optical path length from the probe head 13 to the semiconductor wafer W changes due to the refractive index of the etchant layer E. Hence, the peak positions of the light intensity peaks P2, P3, and the like also shift. Even in this case, since the light intensity distribution corresponding to the lower side (semiconductor wafer W and holding substrate 21) of the upper surface of the semiconductor wafer W shifts by the same amount as a whole, the optical path length difference such as the optical path length difference between the light intensity peaks P2 and P3 is not influenced by the shift in peak position.

When a pattern is formed on the surface opposite to the etching surface of the semiconductor wafer W, if the beam diameter of measurement light is smaller than the pattern, the thickness of each pattern portion is obtained. If the beam diameter is larger than the pattern, an average thickness within the beam range is obtained. In the wet etching apparatus shown in FIG. 1, the semiconductor wafer W is rotating during etching. In this case, an average thickness is measured by thickness measurement.

In selecting the wafer upper surface peak P2 and wafer lower surface peak P3 from the light intensity distribution, a condition such as an optical path length range to be used to calculate a raw thickness value may be applied, as needed, before peak selection processing.

For example, as an optical path length range, an optical path length through which the light intensity peak is to be scanned is set by the scan range of the optical path length in the reference optical path 14b of the reference light generating section 14. An optical path length range to be used to select a light intensity peak may be additionally set from the scanned optical path length range. As such an optical path length range, an optical path length range that includes the wafer upper surface peak P2 and wafer lower surface peak P3 and excludes an extra range outside the peaks, e.g., an optical path length range R1 or R2 shown in FIG. 2B, is preferably set.

Such a condition of the optical path length range or the above-described condition of the threshold value of the light intensity may be given to the thickness calculating section 16 in advance. A condition may be selected and designated from the light intensity distribution displayed on the display device connected to the thickness calculating section 16 by causing the operator to operate a mouse cursor.

Figure 3:
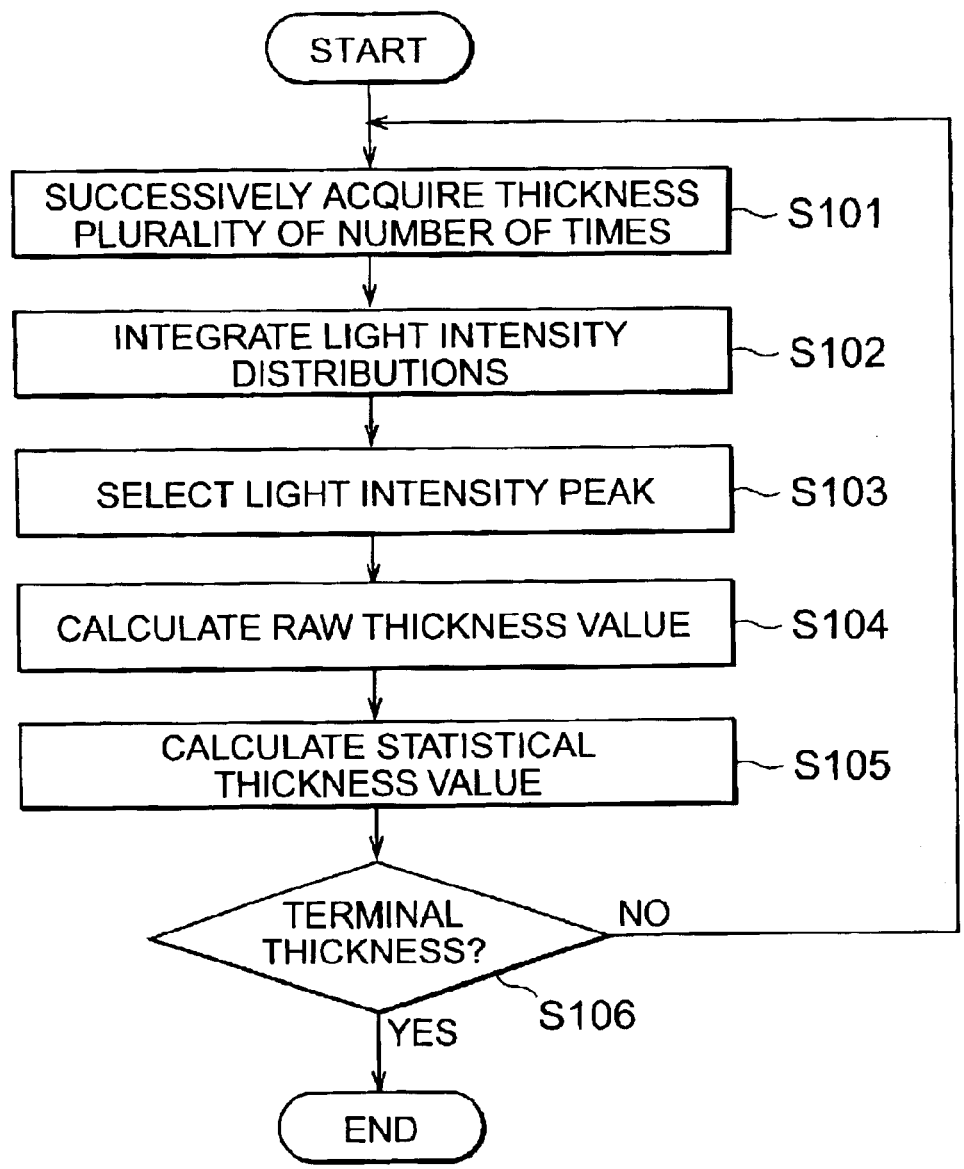
FIG. 3 is a flow chart showing an embodiment of a thickness measuring method.

An example of a detailed procedure of measurement and calculation of the thickness of the semiconductor wafer W at each measurement time will be described next together with the operation of the thickness measuring apparatus A. FIG. 3 is a flow chart schematically showing an embodiment of a thickness measuring method by the thickness measuring apparatus A shown in FIG. 1.

In the embodiment of the thickness measuring method to be described below, light intensity peaks corresponding to the wafer upper surface peak P2 and wafer lower surface peak P3 are selected using the light intensity of each light intensity peak. However, even when the light intensity peaks are selected using the order of light intensity peaks, almost the same procedure as that shown in the flow chart of FIG. 3 is employed.

In this embodiment, instead of acquiring thickness data once at each measurement time when, the thickness of the semiconductor wafer W is measured, a plurality of successive thickness acquisition times are set at a short time interval for each measurement time. Measurement light is supplied from the measurement light source 11 at each thickness acquisition time. In addition, a light intensity distribution (to be referred to as an individual light intensity distribution hereinafter) is generated from light intensity data and reference optical path length data which are acquired at each thickness acquisition time. A raw thickness value at that measurement time is calculated using a plurality of resultant individual light intensity distributions.

The flow chart shown in FIG. 3 shows thickness measurement and calculation at one measurement time. The short time interval of thickness acquisition times means a time interval which is much less than the etching rate of wet etching and in which the thickness of the semiconductor wafer W can be regarded as constant. This time interval is set from etching conditions in each case. More specifically, a time interval of, e.g., about 10 ms is set.

First, measurement light is supplied from the measurement light source 11 at each of continuous thickness acquisition times set for each measurement time, thereby acquiring thickness data a plurality of number of times (step S101). At this time, the raw thickness value calculating section 16b of the thickness calculating section 16 generates a plurality of individual light intensity distributions corresponding to the respective thickness data acquisition cycles.

Next, the individual light intensity distributions acquired at each of the plurality of thickness acquisition times are integrated to generate an integrated light intensity distribution (S102). The wafer upper surface peak P2 and wafer lower surface peak P3 are selected from a plurality of light intensity peaks on the integrated light intensity distribution on the basis of a predetermined selection criterion (S103). If thickness data is acquired once at each measurement time, the integration of light intensity distributions in step S102 is not performed. Light intensity peaks are selected directly using the light intensity distribution obtained by the thickness data acquisition.

When the light intensity peaks are selected from the light intensity distribution, the raw thickness value calculating section 16b calculates the raw thickness value of the semiconductor wafer W at that measurement time from the optical path length difference of the reference optical path length between the selected light intensity peaks P2 and P3 (S104). The statistical thickness value calculating section 16c determines a thickness change line by linear approximation using the raw thickness values, thereby calculating a statistical thickness value (S105).

When the thickness (raw thickness value and statistical thickness value) of the semiconductor wafer W is calculated, it is determined whether the thickness has reached the terminal thickness at that measurement time (S106). If NO in step S106, the thickness of the semiconductor wafer W is measured at the next measurement time in the same way as described above. If YES in step S106, wet etching of the semiconductor wafer W is ended, and thickness measurement of the semiconductor wafer W is ended.

In the above-described thickness measuring method by the thickness measuring apparatus A shown in FIG. 1, thickness data is acquired a plurality of number of times at each measurement time, individual light intensity distributions obtained at the respective thickness acquisition time are integrated, and a raw thickness value is calculated from the resultant integrated light intensity distribution. With this method, the accuracy of the raw thickness value calculated at each measurement time can be increased.

More specifically, of the wafer upper surface peak P2 and wafer lower surface peak P3 (FIG. 2B) to be used to calculate the raw thickness value, the light intensity of the wafer lower surface peak P3 is slightly lower than that of the wafer upper surface peak P2, though the light intensity of the wafer lower surface peak P3 is much higher than that of a noise peak in a silicon bare wafer or the like.

However, when a wafer with a pattern is to be measured, the light intensity of the wafer lower surface peak P3 further decreases because of scattering by the pattern formed on the lower surface of the semiconductor wafer W. In this case, the wafer lower surface peak P3 may be difficult to select. Alternatively, the wafer lower surface peak P3 may be covered with noise. A noise peak may be mistaken as the wafer lower surface peak P3, and an erroneous raw thickness value may be calculated.

To the contrary, in the above-described thickness measuring method, thickness data is acquired a plurality of number of times at each measurement time within a time range in which the thickness of the semiconductor wafer W can be regarded as constant. Individual light intensity distributions obtained from the respective thickness data are integrated and used to calculate the raw thickness value.

At this time, a noise peak changes its position between the individual light intensity distributions and therefore becomes relatively small by integration. However, the wafer lower surface peak P3 is detected at almost the same position and is therefore emphasized on the light intensity distribution by integration. Hence, when the integrated light intensity distribution obtained by integrating a plurality of individual light intensity distributions is used, the statistical accuracy of the S/N ratio of the light intensity peak or the like increases, and the accuracy of the raw thickness value calculated at each measurement time increases. Especially, calculation of an erroneous raw thickness value due to a mistaken wafer lower surface peak P3 is prevented.

For the plurality of individual light intensity distributions to be integrated, since thickness data acquisition is successively performed in a short time, the light intensity distributions can be integrated without any influence of progress of wet etching.

For acquisition of a plurality of thickness data at each measurement time, the thickness data can be stored on a hardware memory and transferred after the plurality of number of times of thickness data acquisition are completed. Alternatively, transfer may be done every time one thickness data is acquired, and this cycle may be repeated.

Figure 4:
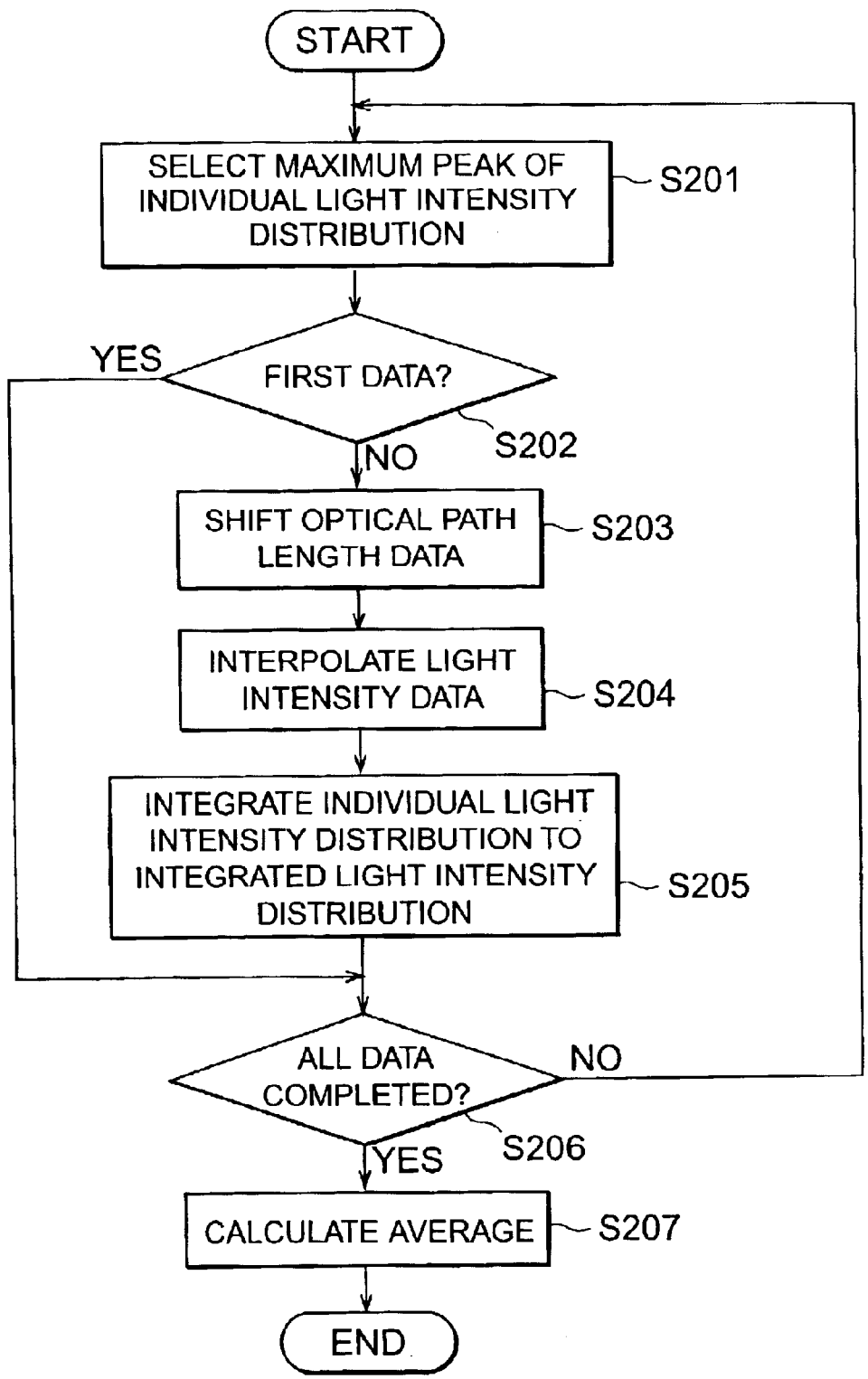
FIG. 4 is a flow chart showing a light intensity distribution integrating method in the flow chart shown in FIG. 3.

Each step of the thickness measuring method shown in FIG. 3 will be described in more detail. FIG. 4 is a flow chart showing an example of light intensity distribution integrating method in step S102 of the flow chart shown in FIG. 3.

In this integrating method, first, a maximum peak at which the light intensity is maximum is selected for each individual light intensity distribution (step S201). Selection of the maximum peak here corresponds to selection of the wafer upper surface peak P2 in each individual light intensity distribution, as described above.

It is determined next whether the individual light intensity distribution is the first thickness data. (thickness data acquired at the first thickness acquisition time) (S202). If YES in step S202, the individual light intensity distribution is a light intensity distribution as the base of an integrated light intensity distribution with which second and subsequent individual light intensity distributions are to be integrated. In addition, the first individual light intensity distribution is used as a reference light intensity distribution in each of the following processes.

On the other hand, if NO in step S202, integration of the individual light intensity distribution is started. First, the optical path length data of the individual light intensity distribution is shifted (S203). The position of the maximum peak (optical path length value) selected on the individual light intensity distribution to be integrated is compared with the position of the maximum peak on the first reference light intensity distribution. The optical path length data (the "optical path length change amount" axis of the graph shown in FIG. 2B) of the individual light intensity distribution is shifted such that the maximum peak positions match.

Next, interpolation processing of the light intensity data of the individual light intensity distribution is executed (S204). Even when the individual light intensity distribution is shifted such that the position of the maximum peak matches the reference light intensity distribution, as described above, a channel in the data of each individual light intensity distribution does not accurately correspond to the optical path length data because of the problem of linearity of the channel interval of the data in some cases. This shift in correspondence is eliminated by interpolating the light intensity data (the "interference light intensity" axis of the graph shown in FIG. 2B). In addition, if data omission has occurred at the start or end of the data by the above-described shift of the individual light intensity distribution, the data is appropriately supplemented.

When shift and interpolation of the individual light intensity distribution are ended, the individual light intensity distribution is integrated with the integrated light intensity distribution (S205). It is determined whether integration of all individual light intensity distributions acquired at that measurement time is ended (S206). If NO in step S206, integration of the next individual light intensity distribution is executed. If YES in step S206, an average is calculated for the integrated light intensity distribution (S207), and integration of light intensity distributions is ended.

In the above-described light intensity distribution integrating method, the maximum peak is selected as the wafer upper surface peak P2 in an individual light intensity distribution, and individual light intensity distributions are integrated using the position of the maximum peak as a reference. At this time, after the individual light intensity distributions are converted such that the positions of the wafer upper surface peaks P2 match, the individual light intensity distributions are integrated. Hence, the raw thickness value of the semiconductor wafer W can be accurately calculated in the integrated light intensity distribution.

As described above with reference to FIGS. 2A and 2B, the thickness of the etchant layer E on the semiconductor wafer W changes depending on the manner the etchant supplied from the nozzle 24a flows on the etching surface. For this reason, the position (optical path length value) of each light intensity peak on the light intensity distribution may vary. In addition, even when the upper surface position of the semiconductor wafer W vibrates due to rotation by the rotational driving section 23, the position of each light intensity peak varies. Furthermore, there is the problem of correspondence between the channel interval in each thickness data and the optical path length.

If individual light intensity distributions are integrated without any appropriate conversion processing, the half-width of a peak may increase due to the shift of each light intensity peak position, or a peak may be divided into a plurality of peaks. Hence, in some cases, even when thickness data are acquired at a plurality of thickness acquisition times, the effect of statistic improvement cannot be sufficiently obtained by simple integration.

To the contrary, in the above integrating method in which individual light intensity distributions undergo shift processing and interpolation processing and are then integrated, the individual light intensity distributions are integrated such that light intensity peaks in them accurately match. Hence, the effect of statistic improvement by integration of a plurality of individual light intensity distributions can be sufficiently obtained. In addition, when the individual light intensity distributions are converted using the wafer upper surface peak P2 as a reference, the positions of the wafer lower surface peaks P3 also match because the time interval of thickness acquisition times is set to rarely change the interval between the wafer upper surface peak P2 and the wafer lower surface peak P3.

Even when light intensity peaks are selected using not the light intensity of each light intensity peak but the order of light intensity peaks, light intensity distributions can be integrated in a similar manner. In this case, preferably, the second light intensity peak from the small reference optical path length side is selected as the wafer upper surface peak P2 from the plurality of light intensity peaks having light intensities more than the threshold value, and individual light intensity distributions are integrated using the position of the wafer upper surface peak P2 as a reference.

If a sufficiently accurate raw thickness value can be obtained only by acquiring thickness data once at each measurement time, acquisition and integration of a plurality of individual light intensity distributions may be omitted regardless of the light intensity peak selecting method using the light intensity or order.

Figure 5:
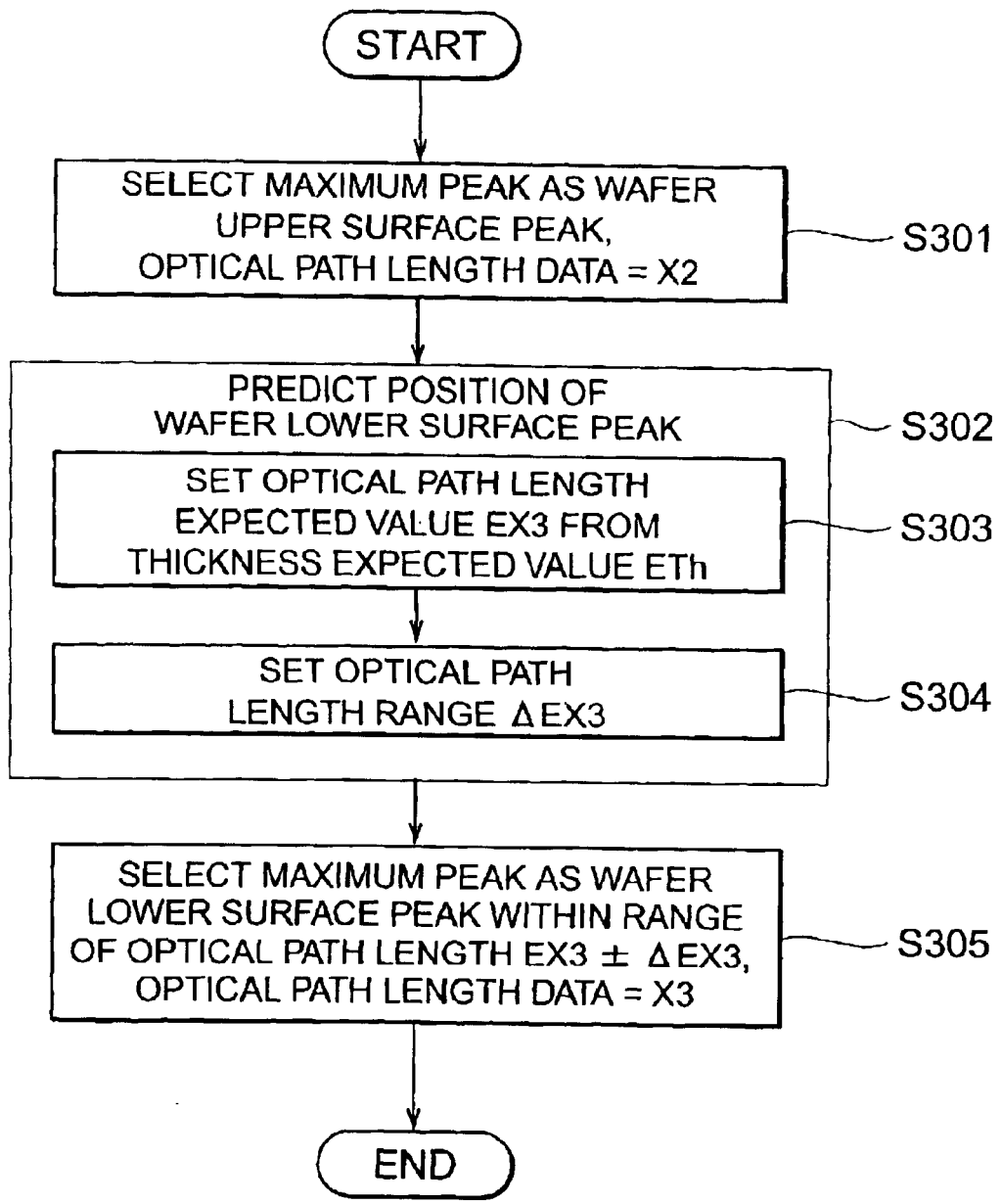
FIG. 5 is a flow chart showing a light intensity peak selecting method in the flow chart shown in FIG. 3.

A detailed method of selecting the wafer upper surface peak and wafer lower surface peak from a plurality of light intensity peaks on a light intensity distribution using their light intensities will be described next. FIG. 5 is a flow chart showing an example of a light intensity peak selecting method in step S103 in the flow chart shown in FIG. 3.

In this selecting method, first, the maximum peak in the integrated light intensity distribution is selected as the wafer upper surface peak P2 (step S301). Define the optical path length data of the selected wafer upper surface peak P2 as X2 (FIG. 2B). The correspondence between the maximum peak and the wafer upper surface peak P2 has already been described above with reference to FIG. 2B and the light intensity distribution integrating method.

Next, the position of the wafer lower surface peak P3 (optical path length data=X3) on the integrated light intensity distribution is predicted using the position X2 of the above wafer upper surface peak P2 as a reference (S302). More specifically, an optical path length expected value EX3 predicted as an optical path length value at which the wafer lower surface peak P3 is located and an optical path length range $\Delta EX3$ which is allowable as the position range of the wafer lower surface peak P3 around the optical path length expected value EX3 are set (S303 and S304).

From a thickness expected value ETh predicted as a thickness Th of the semiconductor wafer W at that measurement time, the optical path length expected value EX3 is set as $EX3 = X2 + ETh$ In addition, the optical path length range $\Delta EX3$ is set to an appropriate range in consideration of the statistical variation in position of the wafer lower surface peak P3.

When position prediction of the wafer lower surface peak P3 is ended, the wafer lower surface peak P3 is selected from the integrated light intensity distribution (S305). Selection of the wafer lower surface peak P3 is done within the optical path length range from the optical path length expected value predicted as the position of the wafer lower surface peak P3, i.e., a position range (lower limit value=EX3−$\Delta EX3$, upper limit value=EX3+$\Delta EX3$) represented by $EX3 \pm \Delta EX3$ More specifically, a maximum peak having a light intensity more than the set threshold value (e.g., the light intensity threshold value Pt shown in FIG. 2B) and a highest light intensity within the above position range is selected as the wafer lower surface peak P3. Thus, selection of the wafer upper surface peak P2 and wafer lower surface peak P3 is ended.

In the above light intensity peak selecting method, the maximum peak on the integrated light intensity distribution is selected first as the wafer upper surface peak P2. In addition, the position X3 of the wafer lower surface peak P3 is predicted using the position X2 of the wafer upper surface peak P2 as a reference, and the wafer lower surface peak P3 is selected within the predicted position range (optical path length range).

The light intensity of the wafer lower surface peak P3 is lower than that of the wafer upper surface peak P2. Under a certain measurement condition, a noise peak or the like may be mistaken as the wafer lower surface peak P3. However, with this thickness measuring method, mistaking the wafer lower surface peak is prevented by integrating a plurality of individual light intensity distributions. In addition, when the wafer lower surface peak P3 is selected within the predicted range, the wafer lower surface peak P3 can be more accurately selected.

When the maximum peak in the predicted position range is equal to or less than the threshold value and a light intensity peak equal to or more than the threshold value falls outside the predicted position range, the wafer lower surface peak P3 is regarded as undetected. In this case, no raw thickness value is calculated. Instead of applying the threshold condition, the wafer lower surface peak P3 may be selected only by the maximum peak condition. When the order is used to select a light intensity peak, the position of the wafer lower surface peak is normally not predicted.

Figure 6:
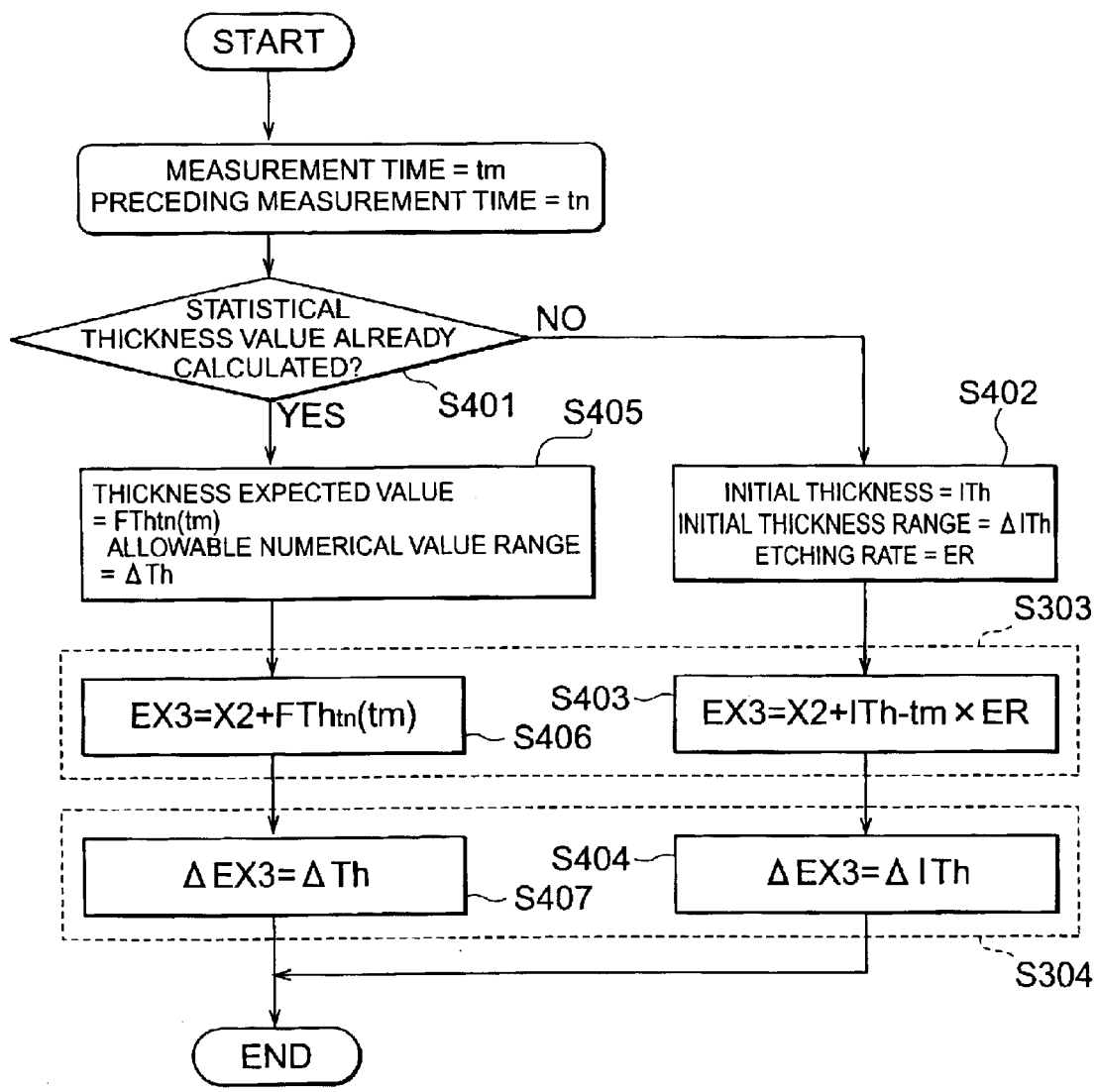
FIG. 6 is a flow chart showing a wafer lower surface peak position predicting method in the flow chart shown in FIG. 5.

Position prediction of the wafer lower surface peak P3 will be described in more detail. FIG. 6 is a flow chart showing an example of a wafer lower surface peak position predicting method in step S302 (S303 and S304) in the flow chart shown in FIG. 5.

In the predicting method shown in FIG. 6, measurement light is supplied from the measurement light source 11 at each of the plurality of successive thickness acquisition times set for each of the plurality of measurement times at a predetermined time interval, thereby executing thickness measurement of the semiconductor wafer W. In the statistical thickness value calculating section 16c of the thickness calculating section 16, determination of the thickness change line by linear approximation with respect to the time-rate change in a plurality of raw thickness values and calculation of the statistical thickness value from the thickness change line are done at each measurement time after sufficient thickness data are stored along with the elapse of a specified time from the first measurement time.

Let tm be the measurement time at which position prediction of the wafer lower surface peak P3, which is indicated by the flow chart shown in FIG. 6, is done, and tn be the preceding measurement time (tn<tm). In addition, $FTh_{tn}(t)$ be the thickness change line as a function of time t determined at the preceding measurement time tn, and $\Delta Th$ be the allowable numerical value range.

In this predicting method, first, it is determined at the measurement time tm whether the specified time has elapsed from the first measurement time, and the statistical thickness value has been calculated (step S401).

If NO in step S401, the position of the wafer lower surface peak P3 is predicted using preset conditions (S402). The set conditions include initial thickness=ITh, initial thickness range=$\Delta$ITh, and etching rate=ER.

The optical path length expected value EX3 and optical path length range $\Delta$EX3 for the position X3 of the wafer lower surface peak P3 are set using the above condition values. At this time, the optical path length expected value EX3 is given by $$EX3 = X2 + ITh - tm \times ER$$

(S403, S303). The optical path length range $\Delta$EX3 is given by $$\Delta EX3 = \Delta ITh$$

(S404, S304).

If YES in step S401, the position of the wafer lower surface peak P3 is predicted using the thickness change line $FTh_{tn}(t)$ and allowable numerical value range $\Delta Th$ calculated before the preceding measurement time tn (S405).

The optical path length expected value EX3 and optical path length range $\Delta$EX3 for the position X3 of the wafer lower surface peak P3 are set using the above condition values. At this time, the optical path length expected value EX3 is given by $$EX3 = X2 + FTh_{tn}(tm)$$

(S406, S303). The optical path length range $\Delta$EX3 is given by $$\Delta EX3 = \Delta Th$$

(S407, S304). Thus, position prediction of the wafer lower surface peak P3 by setting the optical path length expected value EX3 and optical path length range $\Delta$EX3 is ended.

In the above described position predicting method for the wafer lower surface peak P3, the predicting method is changed before and after the elapse of specified time at which calculation of the statistical thickness value is started. Hence, after the elapse of specified time, position prediction can be optimally executed using measured thickness data. In addition, before the elapse of specified time, position prediction can be executed within an appropriate range even when the thickness change line and the like are not obtained.

As the initial thickness ITh, initial thickness range $\Delta$ITh, and etching rate ER used before the elapse of specified time, the operator may input and give appropriate values. Alternatively, numerical values from measurement data in the past may be used.

Figure 7:
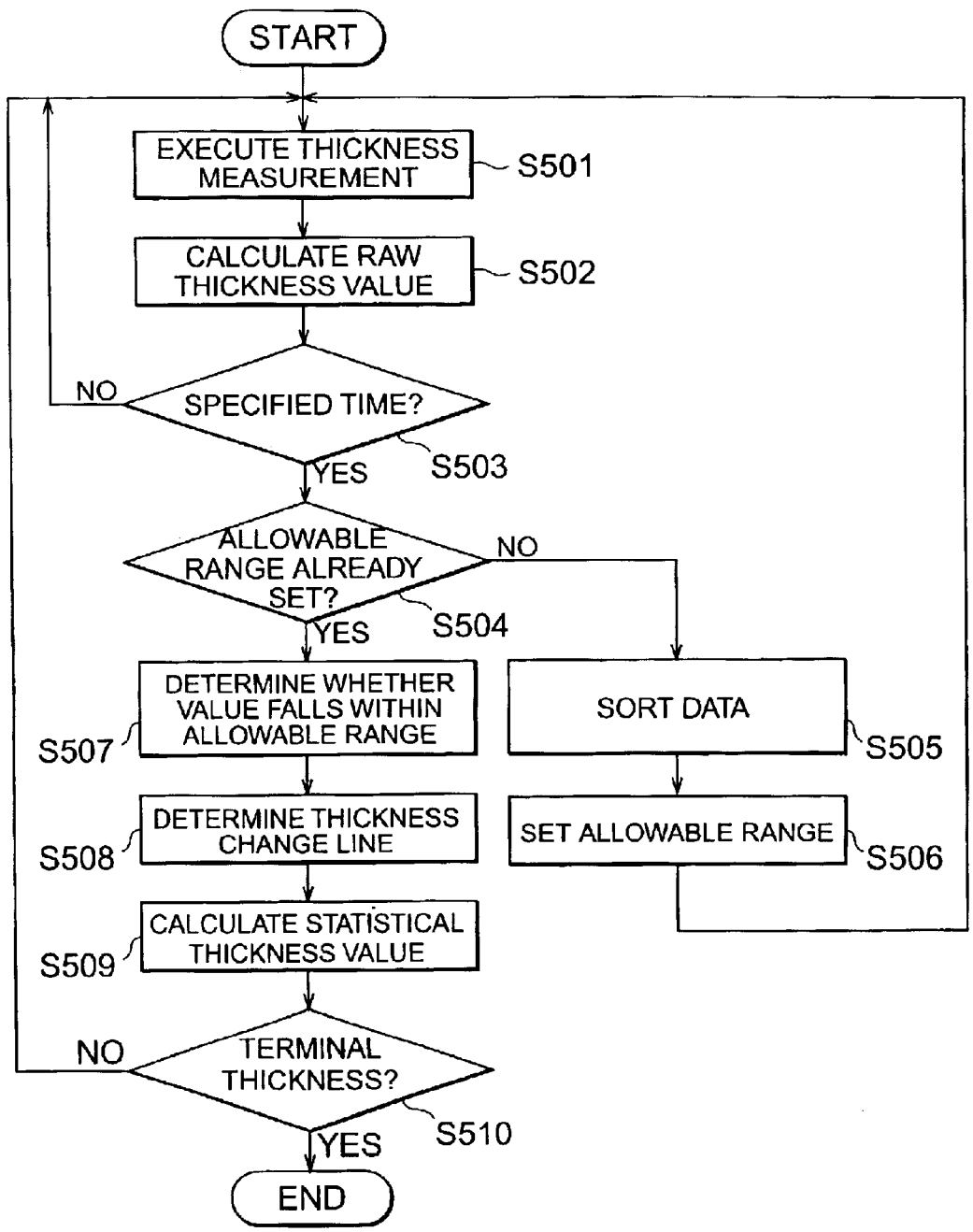
FIG. 7 is a flow chart showing a raw thickness value statistical processing method in the thickness measuring method and wet etching method.

Next, the thickness change line determining method by statistical processing of the raw thickness value, the statistical thickness value calculating method, and the wet etching end time determining method will be described. FIG. 7 is a flow chart showing an example of a raw thickness value statistical processing method in the thickness measuring method and wet etching method by the wet etching apparatus shown in FIG. 1.

In the following description, assume that for thickness measurement of the semiconductor wafer W by the thickness measuring apparatus A, thickness measurement is executed at a plurality of measurement times at a predetermined time interval. The detailed thickness measuring method at each measurement time has already been described above with reference to FIGS. 3 to 6.

First, when wet etching for the semiconductor wafer W is started in the wet etching apparatus B, thickness measurement is executed at each of the plurality of measurement times t (step S501). Preferably, as the time interval that indicates the measurement times, an appropriate time interval, for example, a time interval of 5 Hz for the entire etching time of 1 to 2 min is set in accordance with the etching time or etching rate, and thickness measurement is automatically executed at each measurement time. The time interval may be constant or be changed for the entire etching time.

Measurement light is supplied from the measurement light source 11 at each measurement time or at each of a plurality of thickness acquisition times set for a measurement time. When thickness measurement is executed, data from the photodetector 15 and reference optical path length control section 17 are input to the raw thickness value calculating section 16b through the signal processing circuit 16a of the thickness calculating section 16.

Next, the raw thickness value calculating section 16b generates individual light intensity distributions and integrates the individual light intensity distributions to obtain an integrated light intensity distribution. A raw thickness value RTh(t) at the measurement time t is calculated using two light intensity peaks selected from the integrated light intensity distribution (S502). If the raw thickness value cannot be properly calculated because, e.g., the wafer lower surface peak P3 is not selected within the predicted position range, RTh(t)=0 $\mu$m is set, and the raw thickness value is invalidated.

Next, it is determined whether the time that has elapsed from the first measurement time is a specified time or more (S503). If NO in step S503, execution of thickness measurement and calculation of the raw thickness value are repeated. If YES in step S503, statistical processing of the raw thickness value is started. The specified time is used to determine whether the statistical number of raw thickness value data sufficient for thickness evaluation of the semiconductor wafer W are obtained. The specified time is designated by the time width elapsed from the first measurement time or the number of times of thickness measurement. In the following description, a time width Tc from the first measurement time is defined as the specified time.

If it is determined that the time from the start of thickness measurement has reached the specified time Tc, it is subsequently determined whether the allowable numerical value range for the raw thickness value has already been set (S504). If NO in step S504, it is the first measurement time after the elapse of specified time Tc from the first measurement time, and therefore, the allowable numerical value range is set.

The above-mentioned allowable numerical value range setting method (S505 and S506) at the first measurement time will be described with reference to the graphs schematically shown in FIGS. 8 and 9. In each of the graphs shown in FIGS. 8 to 11 below, the abscissa represents the etching time t (=measurement time t), and the ordinate represents the thickness Th of the semiconductor wafer W at each time.

In addition, for the raw thickness values RTh(t) calculated at the measurement times t shown in each graph, raw thickness values that are validated at the stages of the graphs are indicated by solid dots. Invalid raw thickness values are indicated by hollow dots or not illustrated for the illustrative convenience. A terminal thickness Th0 of the semiconductor wafer W, which is set in advance as the target of wet etching, is indicated by a dotted line parallel to the abscissa.

Figure 8:
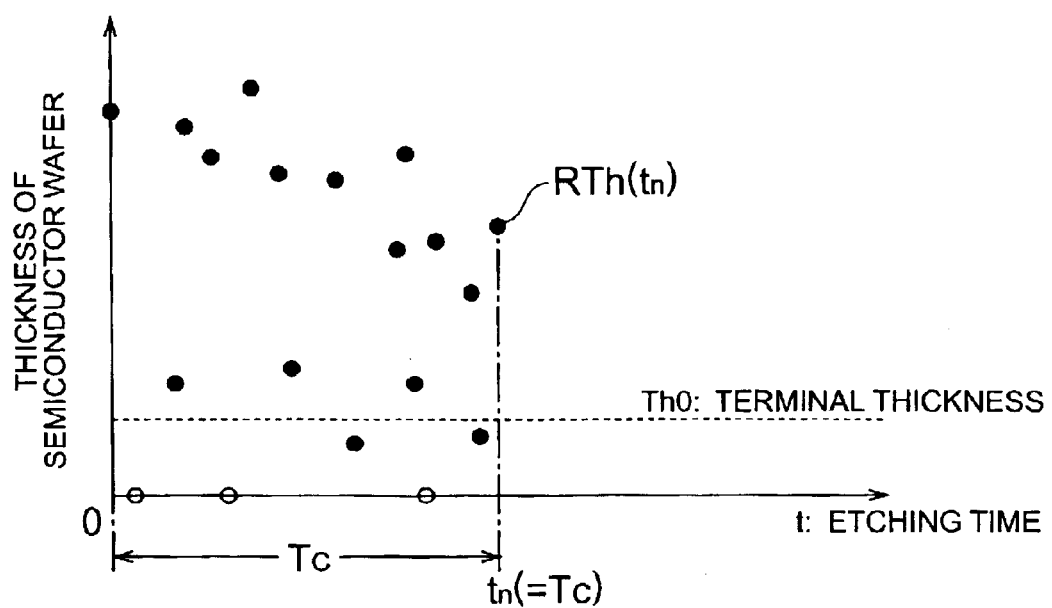
FIG. 8 is a graph schematically showing raw thickness value data.

FIG. 8 is a graph showing an example of the distribution and time-rate change of raw thickness values measured and calculated until the first measurement time tn for which tn=Tc, i.e., the elapsed time has reached the specified time Tc. Of the raw thickness value data at the respective measurement times, raw thickness values at three data points at which RTh(t)=0 $\mu$m are invalidated (hollow dots) because the light intensity peaks are not properly selected. The allowable numerical value range is set using valid data (solid dots).

First, data sorting is performed for a time-rate change in valid raw thickness values RTh(t) indicated by solid dots in FIG. 8 (S505). In data sorting, linear approximation (fitting calculation such as the least square method) is executed for the data of the raw thickness values RTh(t) to obtain a thickness change line and numerical value range (sorting numerical value range) for data sorting. Raw thickness values RTh(t) outside the sorting numerical value range are invalidated to sort the data. This data sorting is executed only a predetermined number of times (e.g., twice), as needed.

Figure 9:
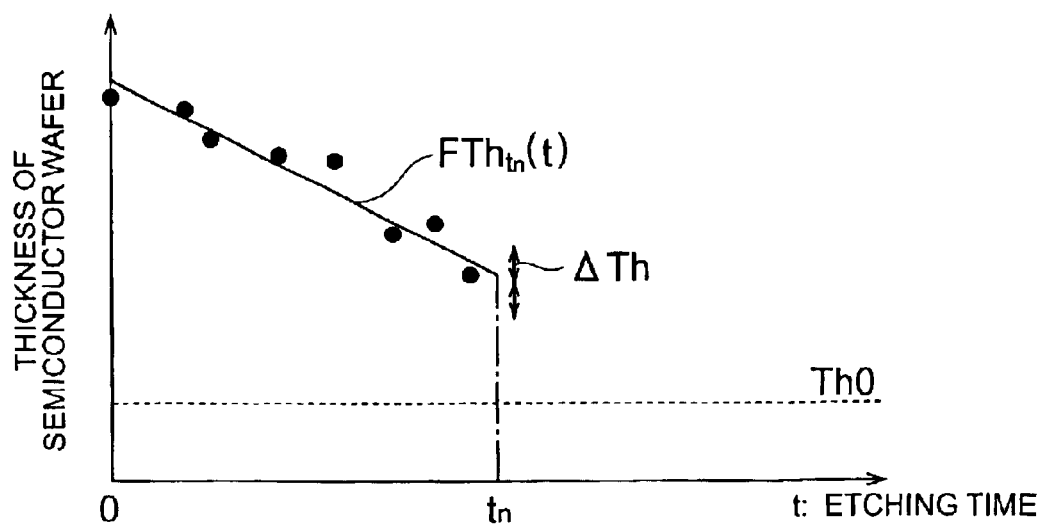
FIG. 9 is a graph showing setting of an allowable numerical value range.

When data sorting is ended, calculation of the thickness change line $FTh_{tn}(t)$ and setting of the allowable numerical value range $\Delta Th$ are executed on the basis of the time-rate change in data of raw thickness values RTh(t) that are valid after data sorting, as shown in FIG. 9 (S506). The allowable numerical value range $\Delta Th$ is used to determine the validity/invalidity of a raw thickness value at each of subsequent measurement times. The thickness change line $FTh_{tn}(t)$ and allowable numerical value range $\Delta Th$ are also used to predict the position of the wafer lower surface peak P3, as shown in the flow chart of FIG. 6. The subfix tn of the thickness change line indicates that the thickness change line is determined at the measurement time tn.

First, linear approximation calculation is executed for the data of raw thickness values (eight data points indicated by full circles in FIG. 9) validated by data sorting, thereby determining the thickness change line $FTh_{tn}(t)$ representing a time-rate change in raw thickness value. For this thickness change line $FTh_{tn}(t)$, a variation value $\sigma$ such as the standard deviation of a raw thickness value RTh(t) that is validated at this stage is calculated. On the other hand, an allowance constant $\Delta Thc$ to be used to obtain the allowable numerical value range $\Delta Th$ is set in advance. From these numerical values, the allowable numerical value range $\Delta Th$ is set as $\Delta Th = \sigma \times \Delta Thc$. When determination of the thickness change line $FTh_{tn}(t)$ at the measurement time tn and setting of the allowable numerical value range $\Delta Th$ are ended, the processing shifts to execution of the next thickness measurement and calculation of raw thickness values.

At second and subsequent measurement times after the elapse of specified time Tc from the first measurement time, the allowable numerical value range has already been set. Hence, the above-described data sorting and (re-)setting of the allowable numerical value range are not executed, and it is determined whether a raw thickness value falls within or outside the allowable range. The method of determining whether a raw thickness value falls within or outside the allowable range at second and subsequent measurement times (S507 to S509) will be described with reference to the graphs schematically shown in FIGS. 10 and 11.

Figure 10:
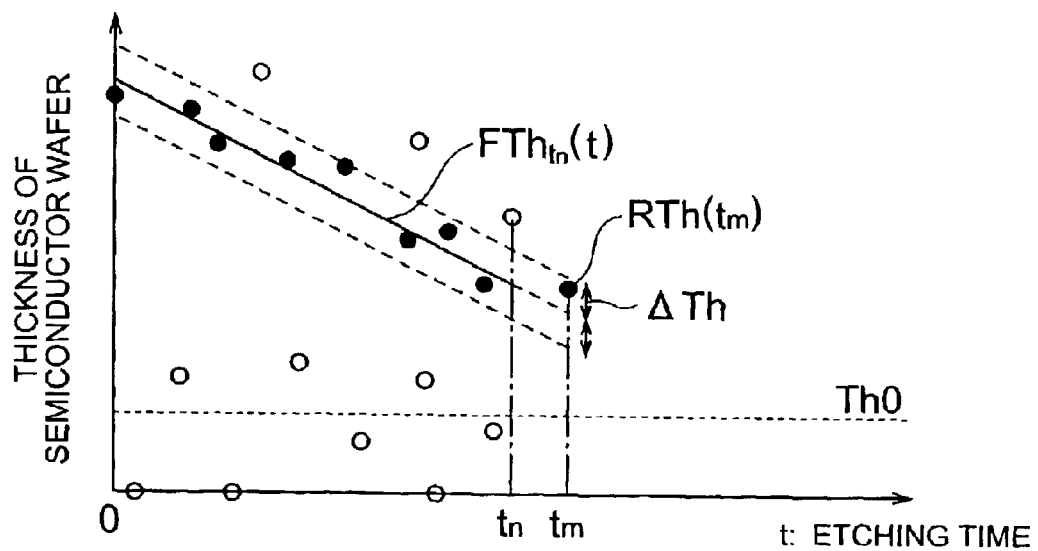
FIG. 10 is a graph showing how whether a raw thickness value falls within or outside the allowable numerical value range is determined.

For the raw thickness value RTh(tm) calculated at the second or subsequent measurement time tm, it is determined whether the value falls within or outside the allowable range (S507), as shown in FIG. 10. More specifically, determination whether the value falls within or outside the allowable range is done by determining whether the value falls within the allowable numerical value range $\Delta Th$ from the thickness change line $FTh_{tn}(t)$ determined at the preceding measurement time (here, the measurement time tn).

That is, the thickness change line $FTh_{tn}(t)$ determined at the preceding measurement time tn is extrapolated (dotted line) to obtain an expected value $FTh_t(tm)$ of the thickness at the current measurement time tm. If the raw thickness value RTh(tm) by thickness measurement executed at the measurement time tm falls within the range from $FTh_{tm}(tm)$ to $\pm\Delta Th$ (indicated by two dashed lines that sandwich the thickness change line $FTh_{tm}(t)$ from upper and lower sides in FIG. 10), the data of the raw thickness value RTh(tm) is validated. Otherwise, the data of the raw thickness value is invalidated. On the basis of the determination result, the thickness change line $FTh_{tm}(t)$ for the current measurement time tm is determined (S508).

Figure 11:
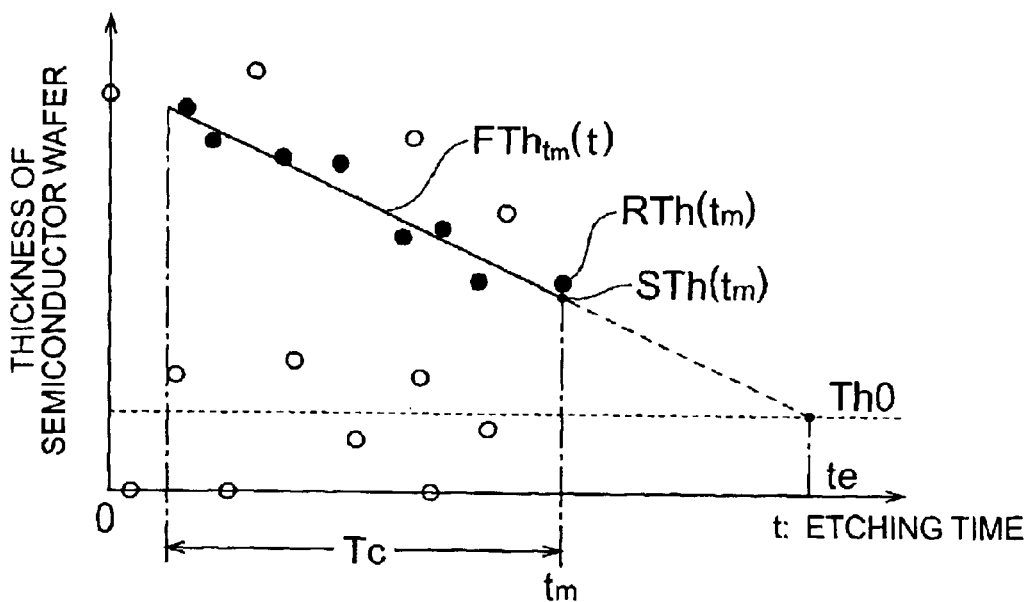
FIG. 11 is a graph showing how a thickness change line is determined and a statistical thickness value is calculated.

In the graph shown in FIG. 10, the raw thickness value RTh(tm) falls within the range of the allowable numerical value range $\Delta Th$ from the preceding thickness change line $FTh_{tm}(t)$. At this time, the raw thickness value RTh(tm) is valid. As shown in FIG. 11, linear approximation calculation is executed for valid raw thickness value data (solid dots) within the time range of the specified time Tc from the measurement time tm, including the raw thickness value RTh(tm), thereby determining the new thickness change line $FTh_{tm}(t)$.

On the other hand, if the raw thickness value RTh(tm) falls outside the range of the allowable numerical value range $\Delta Th$ from the preceding thickness change line $FTh_{tm}(t)$, the raw thickness value RTh(tm) is invalid. At this time, linear approximation calculation is not executed. The preceding thickness change line is directly determined as the thickness change line $FTh_{tm}(t)=FTh_{tm}(t)$ at the current measurement time tm.

For determination about whether a value falls within the allowable range (S507), if the same effect as that of determination about whether a raw thickness value falls within the allowable range is sufficiently obtained by position prediction of the wafer lower surface peak P3 shown in FIG. 6, the determination about whether the value falls within the allowable range may be omitted at the stage of raw thickness value statistical processing.

When the thickness change line $FTh_{tm}(t)$ is determined, a statistical thickness value STh(tm) at the measurement time tm is calculated by $STh(tm)=FTh_{tm}(tm)$ (S509), and the raw thickness value data statistical processing at the measurement time tm is ended. It is determined whether the calculated statistical thickness value STh(tm) has reached the terminal thickness Th0 (S510).

If the statistical thickness value STh(tm) has reached the preset terminal thickness Th0 of wet etching, an end instruction signal is output from the thickness calculating section 16 to the etching control section 25 to end wet etching. On the other hand, if the statistical thickness value STh(tm) has not reached the terminal thickness Th0, as shown in FIG. 11, the wet etching process is continued, and the next thickness measurement is executed.

The effect of the above-described statistical processing for the thickness of the semiconductor wafer W will be described. The thickness (raw thickness value) of the semiconductor wafer W, which is calculated by thickness measurement at each measurement time, has value variations by two factors: (1) a statistical variation (statistical variation) and (2) a variation due to a measurement error (error variation).

(1) Statistical variation always occurs even in thickness measurement that has been properly executed. This variation in raw thickness value falls within the allowable range as data. The influence of the statistical variation is reduced by determining a thickness change line in the above-described statistical processing and calculating a statistical thickness value using the thickness change line.

On the other hand, (2) error variation occurs due to a mistaken wafer lower surface peak P3, or the like. The influence of this variation cannot always be sufficiently removed by determining a thickness change line.

Such an error variation occurs due to, e.g., the following reason. That is, when the angle of the surface of the etchant layer E with respect to measurement light largely changes, the reflecting surface L1 from the liquid surface is not sufficiently input to the probe head 13. The light intensity of the liquid surface peak P1 may then become less than the threshold value Pt. At this time, if the light intensity peaks are selected on the basis of their order, the wafer lower surface peak P3 and substrate lower surface peak P4 are selected as the second and third light intensity peaks. These light intensity peaks are mistaken as the wafer upper surface peak P2 and wafer lower surface peak P3, and an erroneous raw thickness value is obtained. The light intensity of the wafer lower surface peak P3 may also become low.

Even when a noise peak having a high light intensity is generated between the light intensity peaks, this noise peak is mistaken as the wafer lower surface peak P3 or wafer upper surface peak P2, and an erroneous raw thickness value is obtained.

To the contrary, in addition to determination of a thickness change line, when the allowable numerical value range from the thickness change line is set, and determination of a thickness change line and calculation of a statistical thickness value are done using a raw thickness value within the allowable numerical value range, a raw thickness value having a larger error variation than a statistical variation is removed. Hence, the influence of the error variation is reduced. Setting a preferable threshold value in data processing at each measurement time or position prediction of the wafer lower surface peak P3 is also effective in reducing the influence of the error variation.

When the above-described error variation has occurred, the thickness of the holding substrate 21 may be sometimes erroneously obtained as the thickness of the semiconductor wafer W because a light intensity peak is mistaken. To clearly discriminate or exclude such an error variation, the optical thickness of the holding substrate 21 is preferably twice or more the optical thickness of the terminal thickness of the semiconductor wafer W.

When the optical thickness of the holding substrate 21 is sufficiently different from that of the semiconductor wafer W, even if the thickness of the holding substrate 21 is erroneously obtained, the raw thickness value greatly deviates from the thickness change line. Hence, the raw thickness value due to such an error variation can be reliably excluded using setting of the allowable numerical value range from the thickness change line.

For statistical processing of a raw thickness value, if the statistical variation of the raw thickness value is sufficiently small, the raw thickness value may be directly used without calculating any statistical thickness value. Calculation of the statistical thickness value is executed at a measurement time after the specified time has elapsed from the first measurement time, and a sufficient number of raw thickness value data are obtained, as described above. Until the time reaches the specified time, only calculation of the raw thickness value is preferably executed.

In the wet etching apparatus shown in FIG. 1 and wet etching method using the above-described thickness measuring apparatus and thickness measuring method, on the basis of the raw thickness value obtained by the raw thickness value calculating section 16b or the thickness change line and statistical thickness value obtained by the statistical thickness value calculating section 16c, the end of wet etching by stopping supplying the etchant from the etchant supply section 24 or the change of the etching rate can be appropriately controlled through the etching control section 25.

Especially, for the thickness of the semiconductor wafer obtained after the end of wet etching, the variation from the terminal thickness can be reduced by obtaining the end time on the basis of the thickness change line and statistical thickness value, and the preset terminal thickness. Hence, the efficiency and yield in semiconductor manufacturing can be increased.

More specifically, in the above example, when the calculated statistical thickness value is equal to or less than the terminal thickness, the measurement time is set as the end time. In addition, an end instruction signal is output from the thickness calculating section 16 to the etching control section 25, thereby ending wet etching. Other than the above example, an arrangement for predicting the end time using the thickness change line can be employed. That is, as shown in FIG. 11, the thickness change line $FTh_{tm}(t)$ is extrapolated (extended), and an intersection between the thickness change line and a line that indicates the terminal thickness is obtained. A time te at that intersection can be predicted as the end time. When the end time is predicted in advance, wet etching end control can be performed on the basis of the predicted end time.

For example, there is a time lag to some extent after supply of the etchant from the etchant supply section 24 is stopped by the end instruction signal until the etchant on the etching surface is removed by cleaning water. For this reason, in the control method of setting, as the end time, the time when the thickness becomes equal to or smaller than the terminal thickness, overetching may occur. To the contrary, when an end time predicted in advance on the basis of a thickness change line is used, and supply of the etchant is stopped at a time earlier than the end time by the time lag, no overetching occurs. Hence, the terminal thickness of the semiconductor wafer W can be accurately controlled.

The thickness measuring apparatus and thickness measuring method according to the present invention, and the wet etching apparatus and wet etching method using the thickness measuring apparatus and method are not limited to the above-described embodiment, and many changes and modifications of the arrangement or process can be made. For example, the holding substrate 21 maintains the mechanical strength of the semiconductor wafer W to be etched thin. Some semiconductor wafers W can be etched without using the holding substrate 21 depending on their thicknesses. Even in this case, the above-described thickness measuring apparatus and method can be applied.

In the above embodiment, the probe head 13 serving as a light output means is also used as a light input means for receiving reflected light from the semiconductor wafer W. However, a light input means may be arranged separately from the light output means. In this case, since the reflected light is input to an optical fiber different from the optical fiber 13a to the probe head 13, the reflected light and reference light are coupled using, e.g. another optical coupler arranged as the light coupling means in addition to the optical coupler 12. Alternatively, only one of the light input and output means or the light branching and coupling means may be formed from a single light input/output means or optical coupler, and the other means may be formed from separate means.

The etching rate of wet etching need not always be constant. For example, when etching is controlled such that the etching rate becomes low near the terminal thickness (etching end time) on the basis of the time-rate change in thickness of the semiconductor wafer W obtained by thickness measurement, the thickness can more finely be controlled. In this case, instead of the thickness change line, the time-rate change in thickness and the end time may be obtained using a predetermined curve. Alternatively, the time range of raw thickness data in which a time-rate change in thickness is obtained may be divided, and thickness change lines may be separately obtained before and after an etching rate change time.

As the integrating method of acquiring thickness data at a plurality of thickness acquisition times at each measurement time and integrating light intensity distributions, not the integrating method shown in the flow chart of FIG. 4 but various integrating methods can be used. For example, if a positional shift between individual light intensity distributions poses no problem, the data may be integrated without executing optical path length data shift and light intensity data interpolation. In this case, the accuracy of raw thickness value calculation slightly decreases. However, the integrating calculation processing can be executed in a short time.

Alternatively, for each individual light intensity distribution before integration, the wafer upper surface peak and wafer lower surface peak may be temporarily selected, and only individual light intensity distributions in which the wafer upper surface peak and wafer lower surface peak are correctly selected may be integrated to obtain an integrated light intensity distribution. In this case, since the influence of a noise peak or the like is suppressed, an especially accurate raw thickness value can be calculated. In addition, for each individual light intensity distribution, the wafer upper surface peak and wafer lower surface peak may be selected, and simultaneously, the raw thickness value (individual raw thickness value) in each individual light intensity distribution may be calculated. In this case, instead of integrating the individual light intensity distributions themselves, the resultant individual raw thickness values are integrated, and an average value of the individual raw thickness values is obtained, thereby calculating the raw thickness value.

Industrial Applicability

The thickness measuring apparatus and thickness measuring method according to the present invention and the wet etching apparatus and wet etching method using the thickness measuring apparatus and method can be used as a thickness measuring apparatus and method, and the like, which can measure the thickness of a semiconductor wafer during execution of wet etching independently of the presence of an etchant on the etching surface of the semiconductor wafer by measuring the thickness of the semiconductor wafer using a light intensity distribution of interference light obtained by coupling reflected light from the semiconductor wafer and reference light for which a reference optical path length is set, and using light intensity peaks in the light intensity distribution.

When such thickness measurement is used, the actual etching rate or a time-rate change in etching rate in each wet etching process can be known by actual measurement. Hence, instead of determining at the inspection stage for measuring the thickness of the resultant semiconductor wafer after the end of wet etching whether wet etching has been satisfactorily executed, wet etching can be controlled while determining a time-rate change in thickness during etching. Hence, the efficiency and yield in semiconductor manufacturing can be increased.

What is claimed is:

1. A thickness measuring apparatus for measuring a thickness of a semiconductor wafer during execution of wet etching using an etchant, characterized by comprising:

a measurement light source which supplies measurement light at a predetermined measurement time;

light branching means for branching the measurement light from said measurement light source;

light output means for outputting one component of the measurement light branched by said light branching means to the semiconductor wafer as a measurement object so as to irradiate the semiconductor wafer from a side of an etching surface to which the etchant is being supplied;

light input means for inputting reflected light obtained when the measurement light irradiated from said light output means is reflected by the etchant or semiconductor wafer;

reference light generating means for passing the other component of the measurement light branched by said light branching means through a reference optical path designed to be able to change an optical path length so as to generate reference light for which a reference optical path length is set;

light coupling means for obtaining interference light by coupling the reflected light from said light input means to the reference light from said reference light generating means;

photodetection means for detecting the interference light from said light coupling means; and thickness calculating means having raw thickness value calculating means for calculating a raw thickness value of the semiconductor wafer on the basis of an optical path length difference in reference optical path length between two light intensity peaks selected, as a wafer upper surface peak and wafer lower surface peak, from a plurality of light intensity peaks on the basis of a predetermined selection criterion, using a light intensity distribution representing a correlation between the reference optical path length set by said reference light generating means and a light intensity of the interference light detected by said photodetection means at the measurement time.

2. A thickness measuring apparatus according to claim 1, characterized in that said raw thickness value calculating means selects, as the wafer upper surface peak and wafer lower surface peak, second and third light intensity peaks from a side with a small reference optical path length out of a plurality of light intensity peaks each having a light intensity more than a set threshold value in the light intensity distribution.

3. A thickness measuring apparatus according to claim 1, characterized in that said raw thickness value calculating means selects, as the wafer upper surface peak, a light intensity peak having a maximum light intensity out of a plurality of light intensity peaks in the light intensity distribution.

4. A thickness measuring apparatus according to claim 3, characterized in that for a plurality of light intensity peaks in the light intensity distribution, said raw thickness value calculating means obtains an optical path length expected value and optical path length range, in which the wafer lower surface peak is located, using the reference optical path length at the wafer upper surface peak as a reference, and selects the wafer lower surface peak within the optical path length range from the optical path length expected value.

5. A thickness measuring apparatus according to claim 4, characterized in that said raw thickness value calculating means selects, as the wafer lower surface peak, a light intensity peak which has a light intensity more than a set threshold value within the optical path length range from the optical path length expected value and whose light intensity is maximum within the optical path length range.

6. A thickness measuring apparatus according to any one of claims 1 to 5, characterized in that said measurement light source supplies the measurement light, at the measurement time, at each of a plurality of successive thickness acquisition times set for the measurement time, and said raw thickness value calculating means integrates individual light intensity distributions acquired at the plurality of thickness acquisition times or individual raw thickness values calculated from the individual light intensity distributions to calculate the raw thickness value.

7. A thickness measuring apparatus according to claim 6, characterized in that said raw thickness value calculating means integrates the individual light intensity distributions while matching positions of the wafer upper surface peaks to each other to obtain an integrated light intensity distribution and calculates the raw thickness value using the integrated light intensity distribution.

8. A thickness measuring apparatus according to claim 6, characterized in that said raw thickness value calculating means integrates the individual raw thickness values calculated from the individual light intensity distributions and obtains an average value of the individual raw thickness values to calculate the raw thickness value.

9. A thickness measuring apparatus according to any one of claims 1 to 8, characterized in that said light input means and light output means is formed from a single light input/output means, and said light branching means and light coupling means is formed from a single optical coupler.

10. A thickness measuring apparatus according to any one of claims 1 to 9, characterized in that said measurement light source supplies the measurement light at each of a plurality of measurement times at a predetermined time interval, and said thickness calculating means has statistical thickness value calculating means for determining a thickness change line by linear approximation for a time-rate change in the plurality of raw thickness values at each of the measurement times after an elapse of a specified time from the first measurement time so as to calculate a statistical thickness value from the thickness change line.

11. A thickness measuring apparatus according to claim 10, characterized in that said statistical thickness value calculating means sets an allowable numerical value range from the thickness change line and executes determination of the thickness change line and calculation of the statistical thickness value for the time-rate change in the plurality of raw thickness values within the allowable numerical value range.

12. A wet etching apparatus having said thickness measuring apparatus of any one of claims 1 to 11, comprising:

etchant supply means for supplying the etchant to the etching surface of the semiconductor wafer as an object of wet etching; and etching control means for controlling supply of the etchant by said etchant supply means.

13. A wet etching apparatus according to claim 12, characterized in that said thickness calculating means of said thickness measuring apparatus obtains an end time of wet etching on the basis of a terminal thickness preset, from the obtained time-rate change in thickness of the semiconductor wafer and outputs an end instruction signal to instruct the end time, and said etching control means causes said etchant supply means to stop supply of the etchant on the basis of the end instruction signal.

14. A wet etching apparatus according to claim 12 or 13, characterized by comprising a holding substrate arranged on a surface side opposite to the etching surface of the semiconductor wafer to hold the semiconductor wafer, said holding substrate having an optical thickness not less than twice an optical thickness of the terminal thickness of the semiconductor wafer.

15. A thickness measuring method of measuring a thickness of a semiconductor wafer during execution of wet etching using an etchant, characterized by comprising:

the measurement light supply step of supplying measurement light from a measurement light source at a predetermined measurement time;

the light branching step of branching the measurement light from the measurement light source;

the light output step of outputting one component of the measurement light branched in the light branching step to the semiconductor wafer as a measurement object so as to irradiate the semiconductor wafer from a side of an etching surface to which the etchant is being supplied;

the light input step of inputting reflected light obtained when the measurement light irradiated in the light output step is reflected by the etchant or semiconductor wafer;

the reference light generating step of passing the other component of the measurement light branched in the light branching step through a reference optical path designed to be able to change an optical path length so as to generate reference light for which a reference optical path length is set;

the light coupling step of making interference light by coupling the reflected light input in the light input step to the reference light generated in the reference light generating step;

the photodetection step of detecting the interference light coupled in the light coupling step; and the thickness calculating step including the raw thickness value calculating step of calculating a raw thickness value of the semiconductor wafer on the basis of an optical path length difference in reference optical path length between two light intensity peaks selected, as a wafer upper surface peak and wafer lower surface peak, from a plurality of light intensity peaks on the basis of a predetermined selection criterion, using a light intensity distribution representing a correlation between the reference optical path length set in the reference light generating step and a light intensity of the interference light detected in the photodetection step at the measurement time.

16. A thickness measuring method according to claim 15, characterized in that in the raw thickness value calculating step, second and third light intensity peaks from a side with a small reference optical path length are selected, as the wafer upper surface peak and wafer lower surface peak, from a plurality of light intensity peaks each having a light intensity more than a set threshold value in the light intensity distribution.

17. A thickness measuring method according to claim 15, characterized in that in the raw thickness value calculating step, a light intensity peak having a maximum light intensity is selected, as the wafer upper surface peak, from a plurality of light intensity peaks in the light intensity distribution.

18. A thickness measuring method according to claim 17, characterized in that in the raw thickness value calculating step, for a plurality of light intensity peaks in the light intensity distribution, an optical path length expected value and optical path length range, in which the wafer lower surface peak is located, are obtained using the reference optical path length at the wafer upper surface peak as a reference, and the wafer lower surface peak is selected within the optical path length range from the optical path length expected value.

19. A thickness measuring method according to claim 18, characterized in that in the raw thickness value calculating step, a light intensity peak which has a light intensity more than a set threshold value within the optical path length range from the optical path length expected value and whose light intensity is maximum within the optical path length range is selected as the wafer lower surface peak.

20. A thickness measuring method according to any one of claims 15 to 19, characterized in that in the measurement light supply step, the measurement light is supplied from the measurement light source, at the measurement time, at each of a plurality of successive thickness acquisition times set for the measurement time, and in the raw thickness value calculating step, individual light intensity distributions acquired at the plurality of thickness acquisition times or individual raw thickness values calculated from the individual light intensity distributions are integrated to calculate the raw thickness value.

21. A thickness measuring method according to claim 20, characterized in that in the raw thickness value calculating step, the individual light intensity distributions are integrated while matching positions of the wafer upper surface peaks to each other to obtain an integrated light intensity distribution, and the raw thickness value is calculated using the integrated light intensity distribution.

22. A thickness measuring method according to claim 20, characterized in that in the raw thickness value calculating step, the individual raw thickness values calculated from the individual light intensity distributions are integrated, and an average value of the individual raw thickness values is obtained to calculate the raw thickness value.

23. A thickness measuring method according to any one of claims 15 to 22, characterized in that in the measurement light supply step, the measurement light is supplied from the measurement light source at each of a plurality of measurement times at a predetermined time interval, and the thickness calculating step includes the statistical thickness value calculating step of determining a thickness change line by linear approximation for a time-rate change in the plurality of raw thickness values at each of the measurement times after an elapse of a specified time from the first measurement time so as to calculate a statistical thickness value from the thickness change line.

24. A thickness measuring method according to claim 23, characterized in that in the statistical thickness value calculating step, an allowable numerical value range from the thickness change line is set, and determination of the thickness change line and calculation of the statistical thickness value are executed for the time-rate change in the plurality of raw thickness values within the allowable numerical value range.

25. A wet etching method including the thickness measuring method of any one of claims 15 to 24, comprising:
   the etching start step of supplying the etchant to the etching surface of the semiconductor wafer as an object of wet etching so as to start wet etching;
   the thickness measuring step of measuring a thickness of he semiconductor wafer by the thickness measuring method during execution of wet etching started in the etching start step; and
   the etching ending step of stopping supplying the etchant to end wet etching.

26. A wet etching method according to claim 25, characterized by further comprising the end time calculating step of obtaining an end time of wet etching on the basis of a terminal thickness preset, from the time-rate change in thickness of the semiconductor wafer obtained in the thickness measuring step, and wherein
   in the etching ending step, supply of the etchant is stopped on the basis of the end time obtained in the end time calculating step.

27. A wet etching method according to claim 26, characterized in that in the end time calculating step, on the basis of the time-rate change in thickness of the semiconductor wafer, the measurement time when the obtained thickness of the semiconductor wafer is not more than the terminal thickness is obtained as the end time.

28. A wet etching method according to claim 26, characterized in that in the end time calculating step, the end time is predicted using the time-rate change in thickness of the semiconductor wafer.

* * * * *